(12) United States Patent
Ahn et al.

(10) Patent No.: US 7,859,605 B2
(45) Date of Patent: Dec. 28, 2010

(54) THIN FILM TRANSISTOR SUBSTRATE AND FABRICATING METHOD THEREOF, LIQUID CRYSTAL DISPLAY PANEL USING THE SAME AND FABRICATING METHOD THEREOF

(75) Inventors: Byung Chul Ahn, Anyang-si (KR); Byoung Ho Lim, Gumi-si (KR); Jae Jun Ahn, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/458,784

(22) Filed: Jul. 22, 2009

(65) Prior Publication Data

US 2009/0284676 A1    Nov. 19, 2009

Related U.S. Application Data

(62) Division of application No. 11/167,097, filed on Jun. 28, 2005, now Pat. No. 7,580,106.

(30) Foreign Application Priority Data

Dec. 31, 2004    (KR) .................. 10-2004-118602

(51) Int. Cl.
*G02F 1/136* (2006.01)
(52) U.S. Cl. .................. 349/43; 349/42; 349/152
(58) Field of Classification Search .................. 349/42, 349/43, 152
See application file for complete search history.

(56) References Cited

U.S. PATENT DOCUMENTS

| | | |
|---|---|---|
| 5,162,933 A | 11/1992 | Kakuda et al. |
| 5,317,433 A | 5/1994 | Miyawaki et al. |
| 5,339,181 A | 8/1994 | Kim et al. |
| 5,462,887 A | 10/1995 | Gluck |
| 5,668,379 A | 9/1997 | Ono et al. |
| 5,731,856 A | 3/1998 | Kim et al. |
| 5,771,083 A | 6/1998 | Fujihara et al. |
| 5,793,460 A | 8/1998 | Yang |
| 5,847,781 A | 12/1998 | Ono et al. |
| 6,188,452 B1 | 2/2001 | Kim et al. |

(Continued)

*Primary Examiner*—David Nelms
*Assistant Examiner*—Nathanael R Briggs
(74) *Attorney, Agent, or Firm*—McKenna Long & Aldridge

(57) ABSTRACT

A thin film transistor substrate and a fabricating method thereof; and a liquid crystal display panel employing the same and a fabricating method thereof for simplifying a process are disclosed. A thin film transistor substrate, including: a gate line on a substrate; a data line crossing the gate line having a gate insulating film therebetween to define a pixel area; a pixel hole in the pixel area; a pixel electrode made of a transparent conductive film on the gate insulating film in the pixel hole in the pixel area; and a thin film transistor including a gate electrode connected to the gate line, a source electrode connected to the data line, a drain electrode connected to the pixel electrode, and a semiconductor layer defining a channel between the source electrode and the drain electrode, wherein the semiconductor layer overlaps with a source/drain metal pattern including the data line, the source electrode, and the drain electrode; wherein the drain electrode protrudes from the semiconductor layer toward an upper portion of the pixel electrode, and the drain electrode connects to the pixel electrode; and wherein the semiconductor layer is removed from where it overlaps the transparent conductive film.

21 Claims, 29 Drawing Sheets

U.S. PATENT DOCUMENTS

| | | |
|---|---|---|
| 6,704,085 B2 * | 3/2004 | Nishimura et al. .......... 349/141 |
| 6,771,346 B2 | 8/2004 | Sugimoto et al. |
| 7,060,541 B2 | 6/2006 | Lee et al. |
| 2002/0135293 A1 | 9/2002 | Aruga |
| 2003/0071944 A1 * | 4/2003 | Baek ........................ 349/113 |
| 2003/0184687 A1 * | 10/2003 | Matsubara ................... 349/43 |
| 2003/0197181 A1 * | 10/2003 | Yun ........................... 257/72 |
| 2004/0085488 A1 | 5/2004 | Cho et al. |
| 2004/0165120 A1 * | 8/2004 | Woo et al. ..................... 349/42 |
| 2005/0094079 A1 | 5/2005 | Yoo et al. |

* cited by examiner

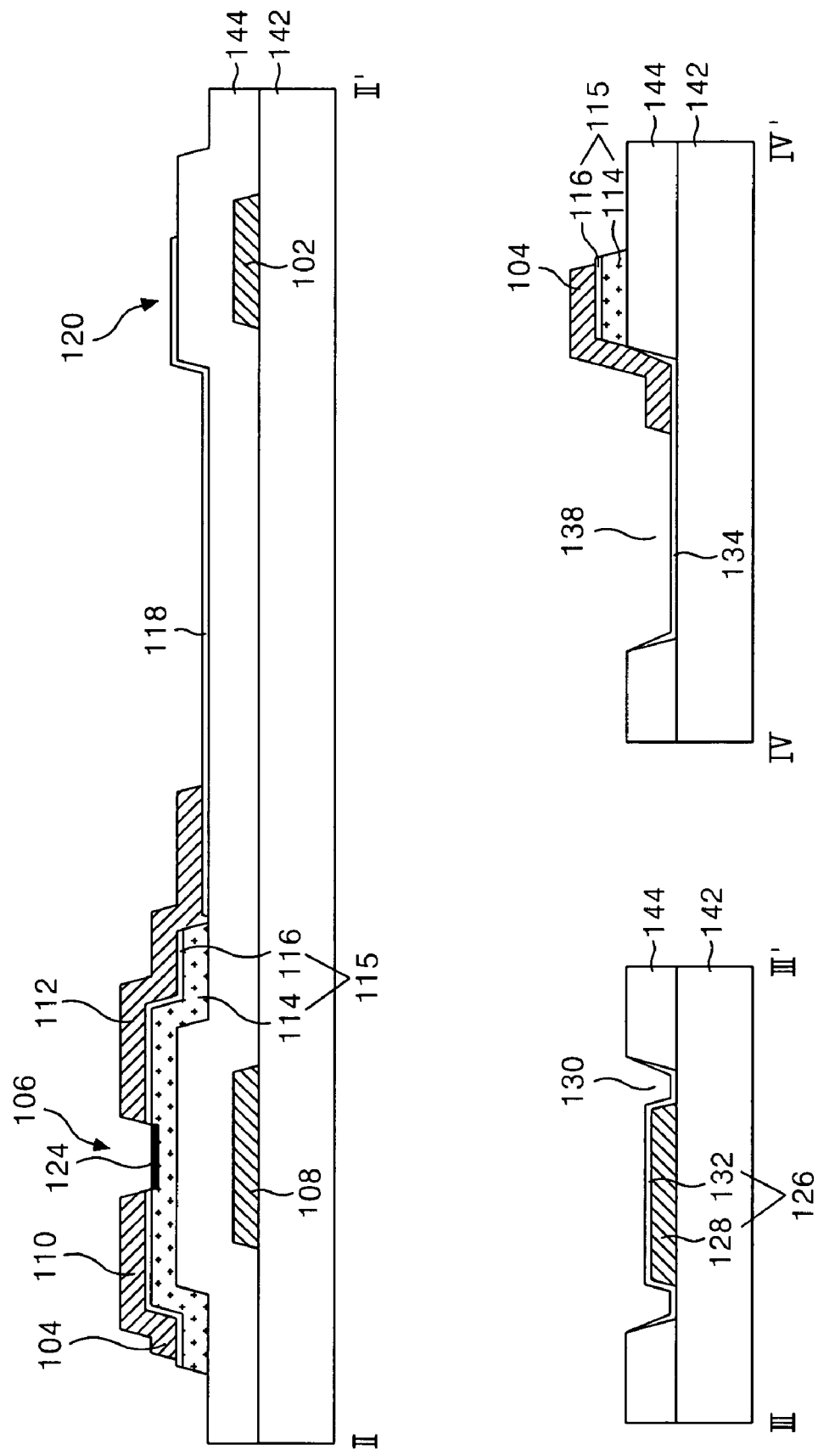

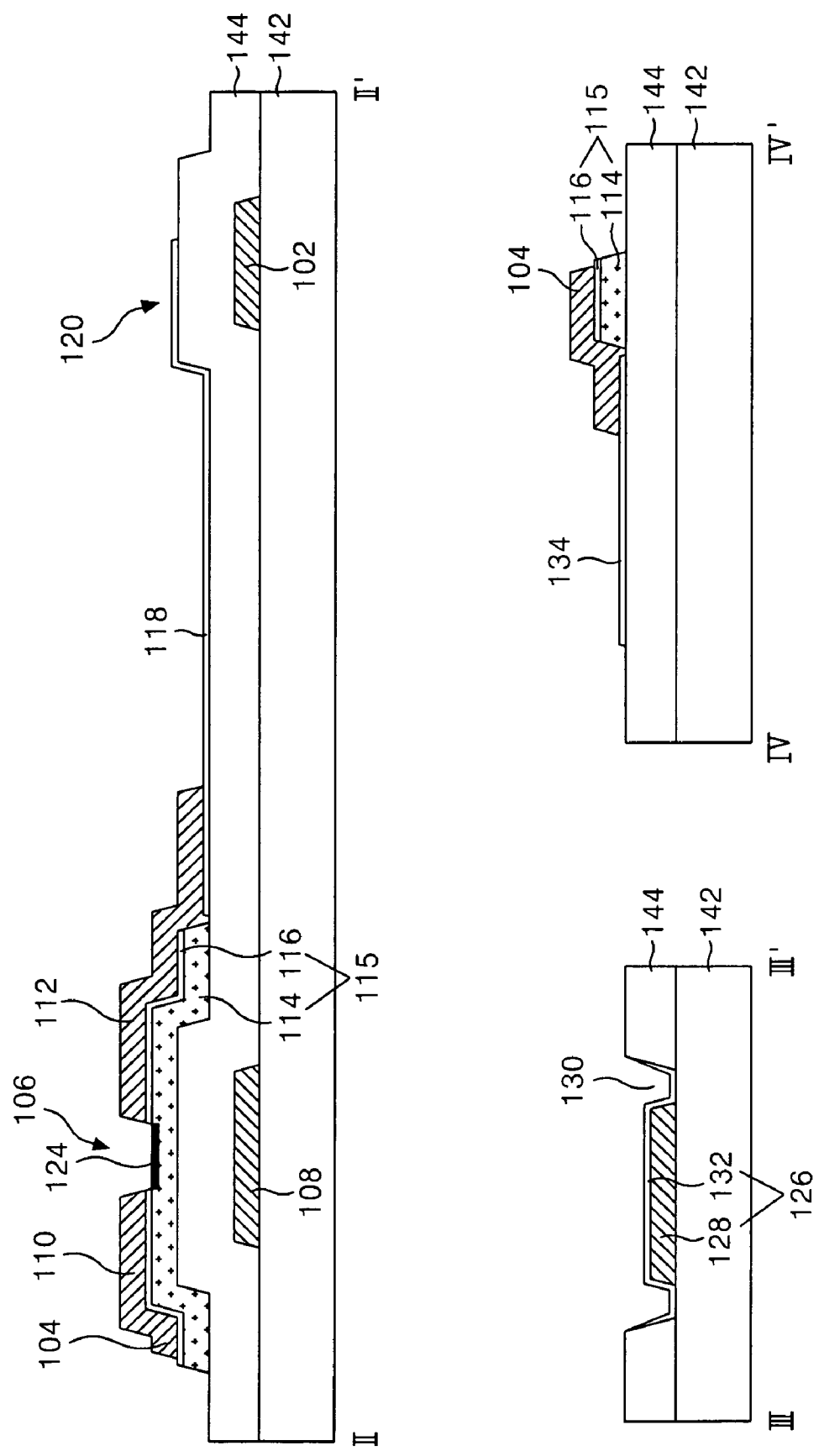

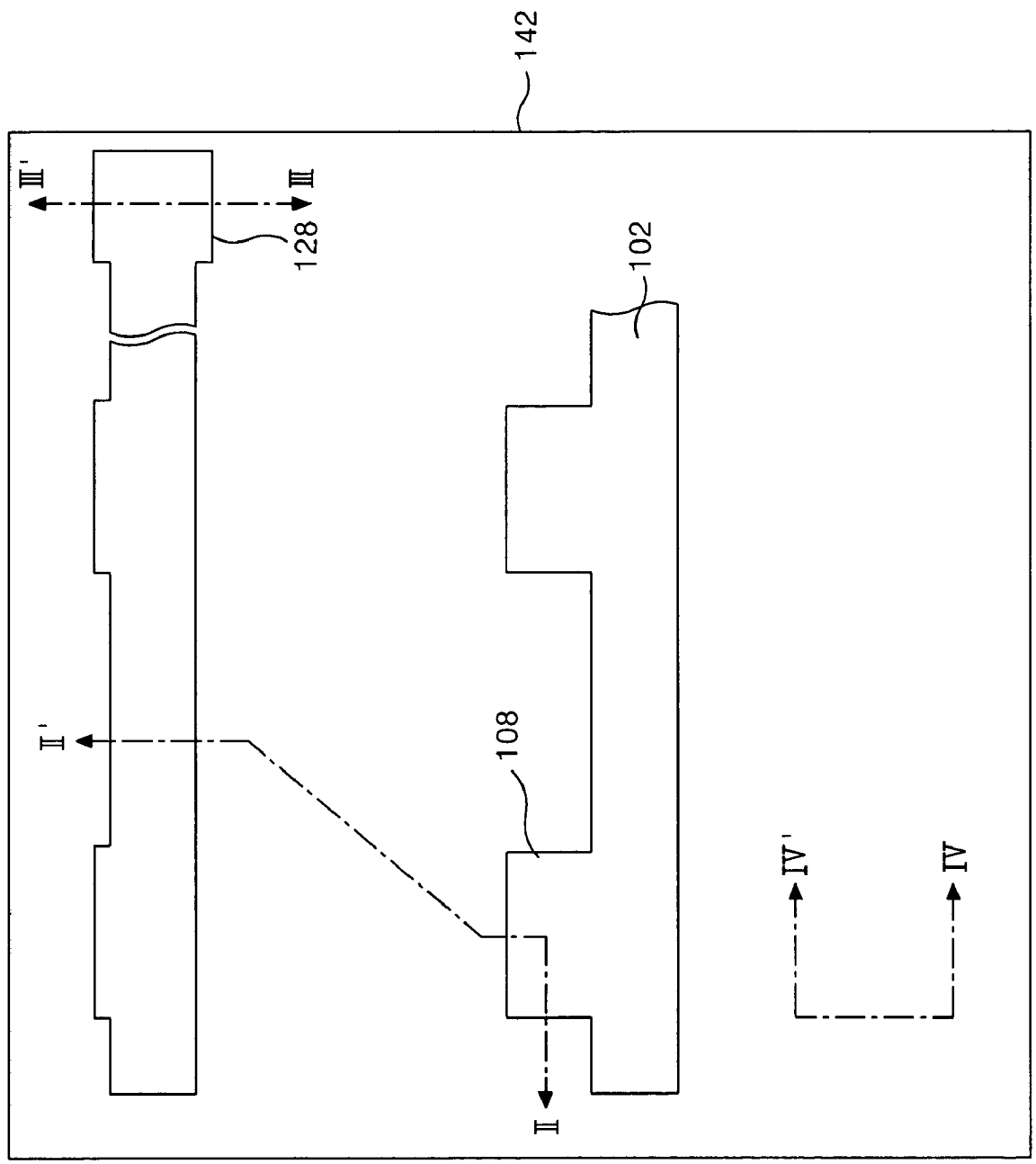

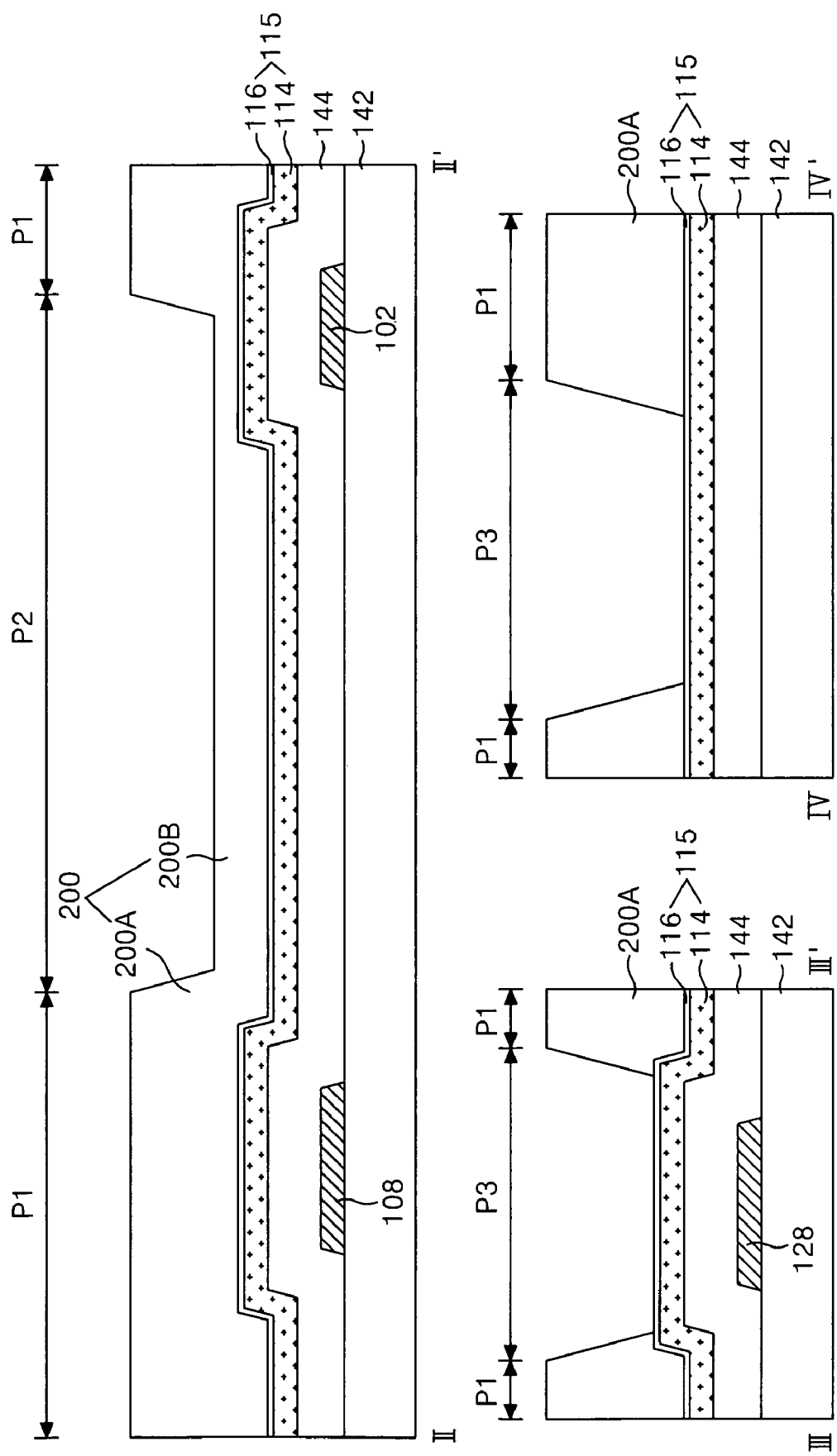

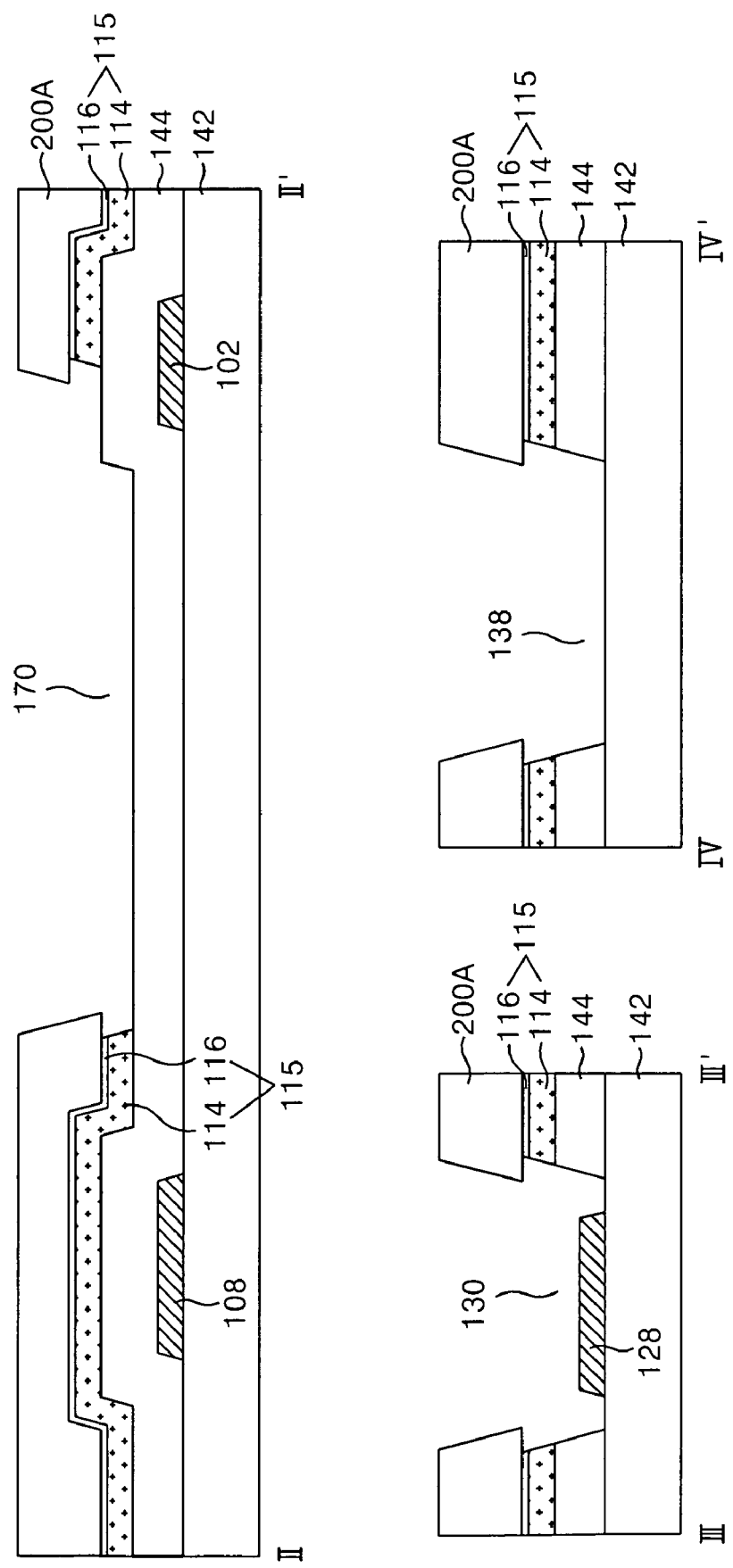

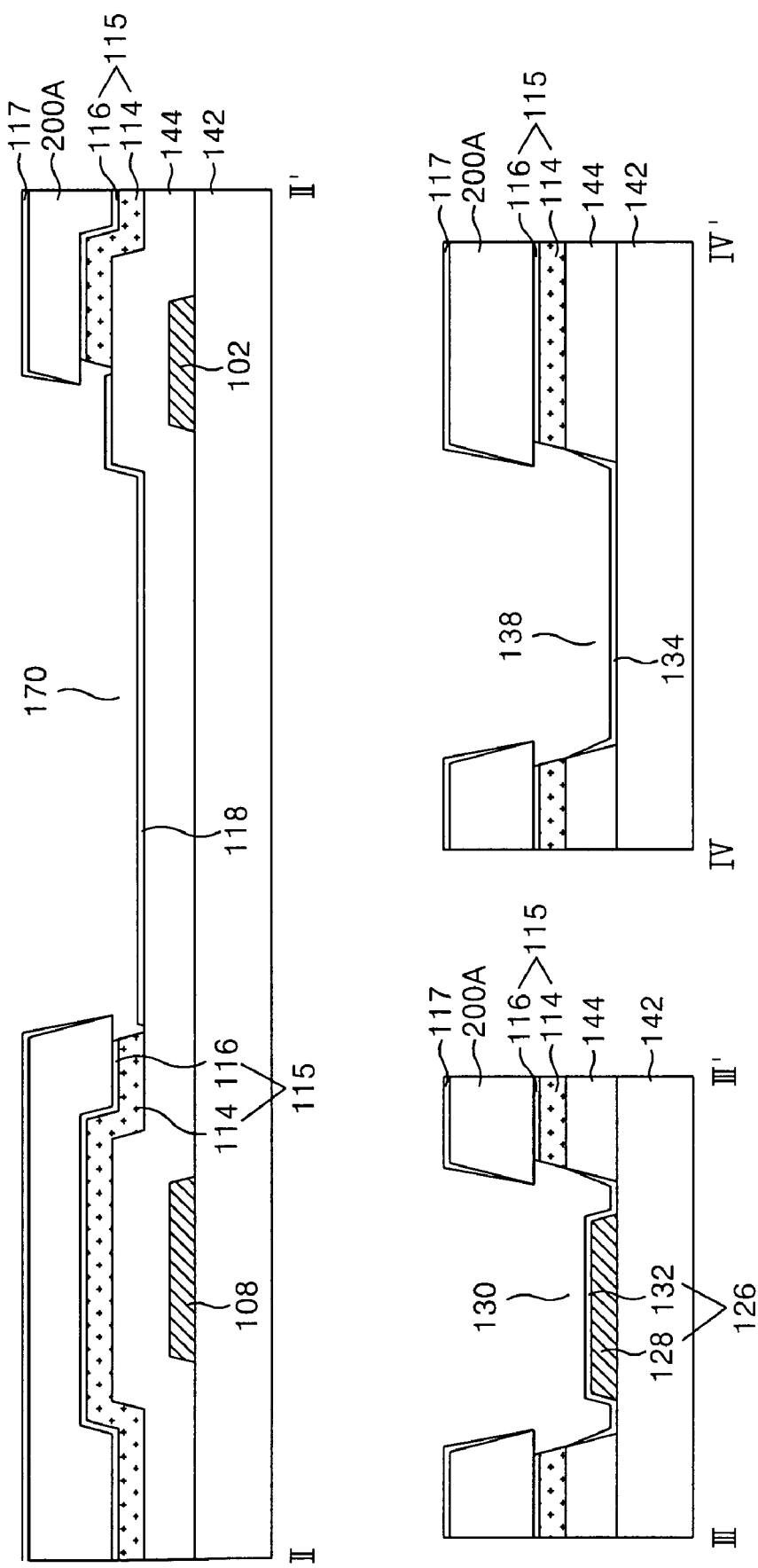

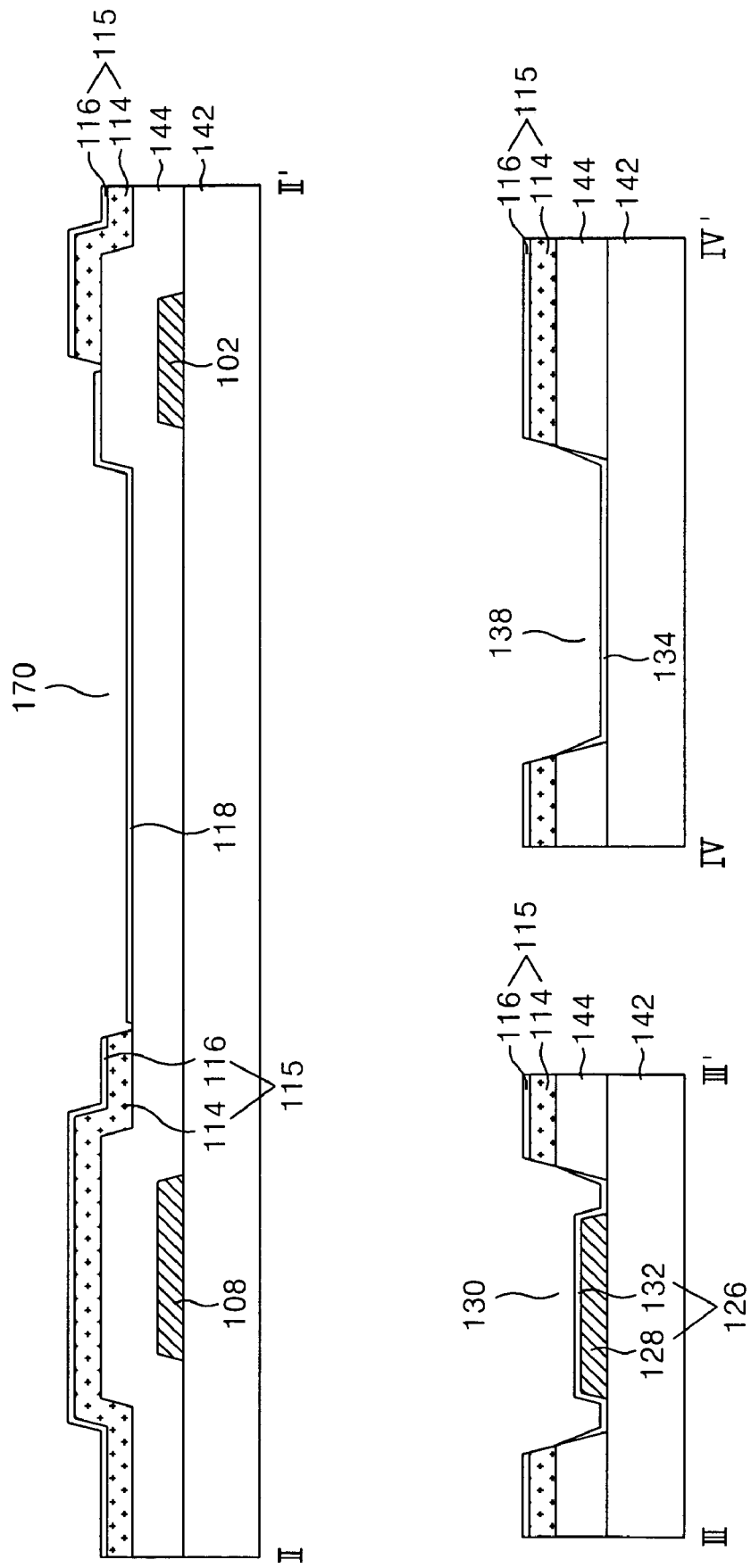

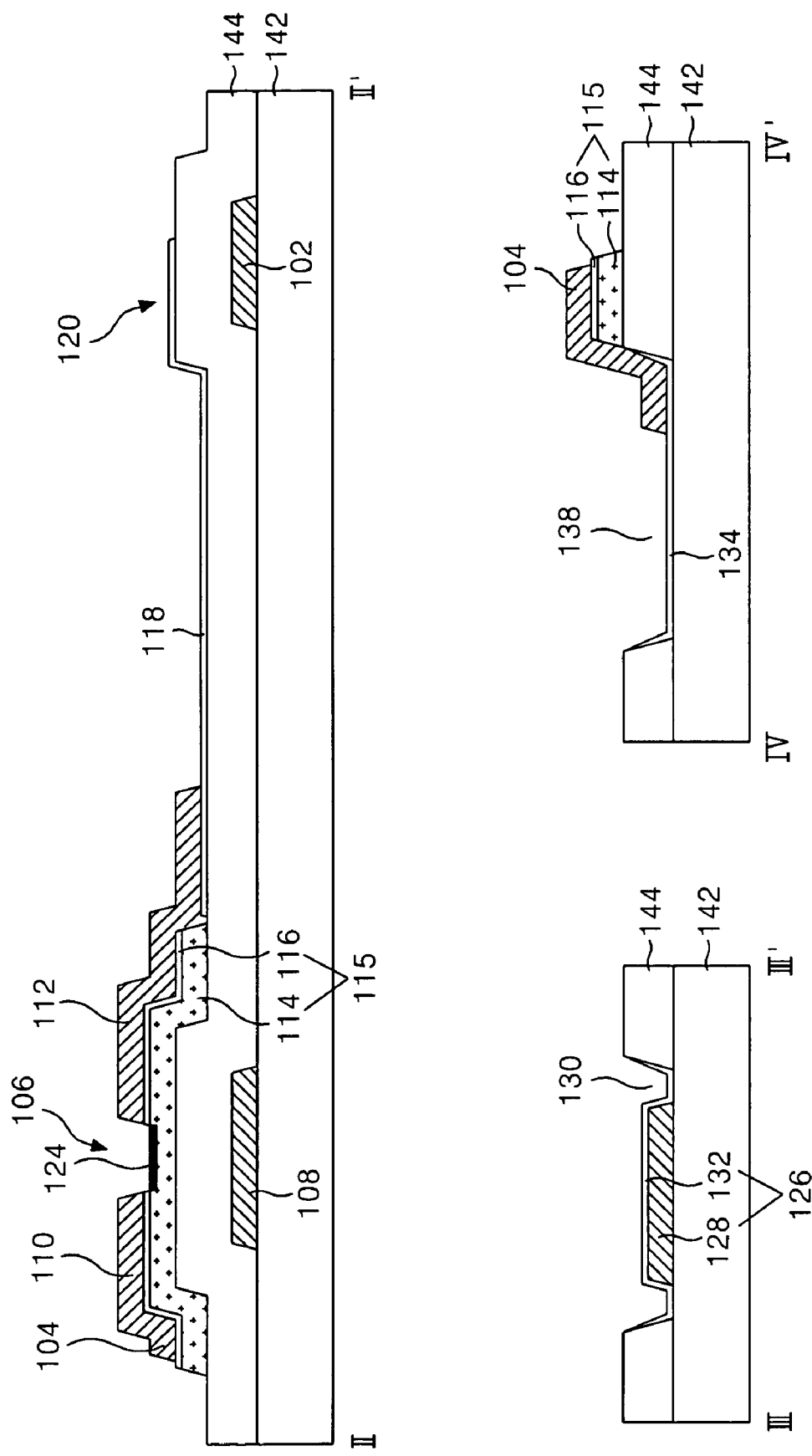

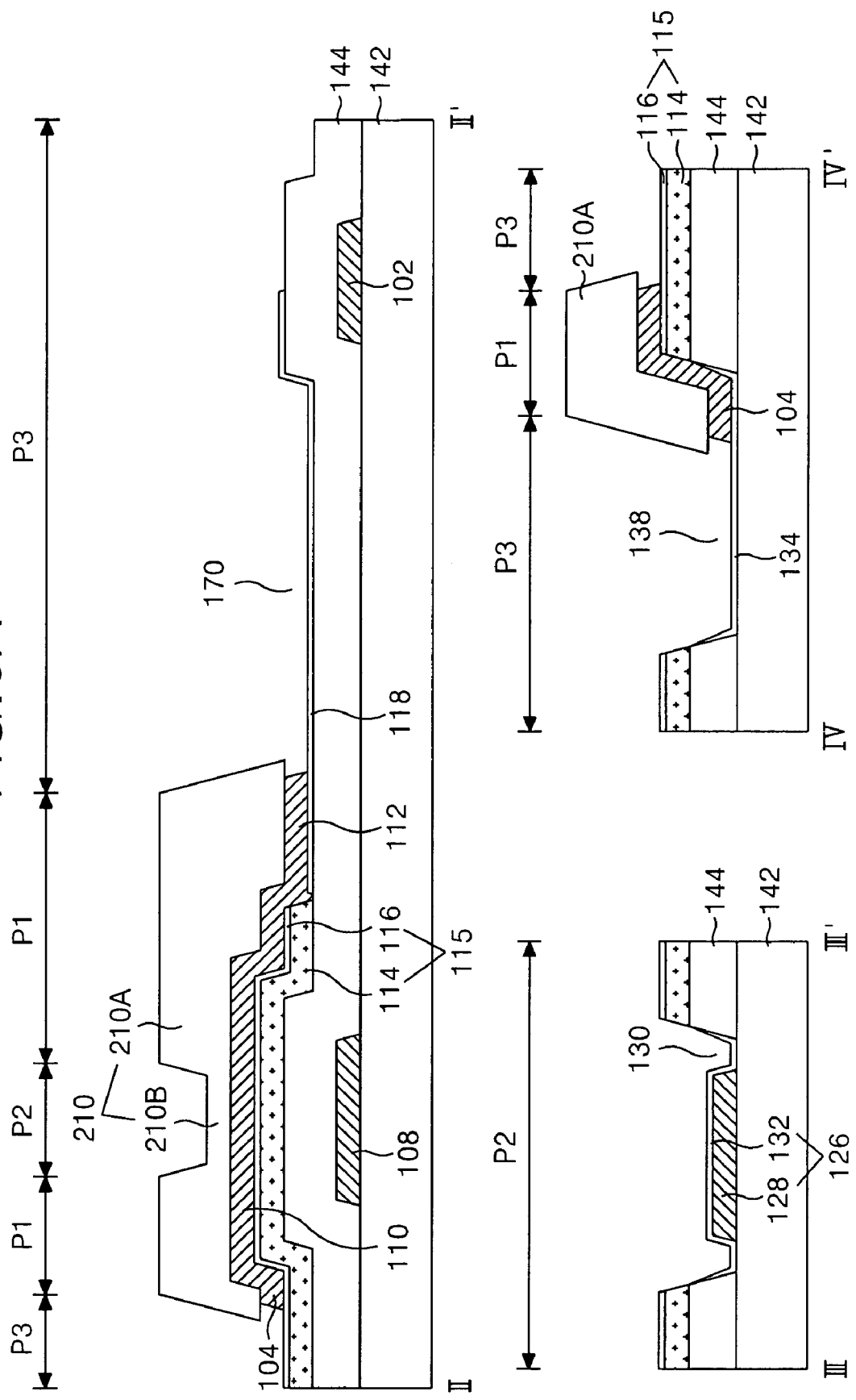

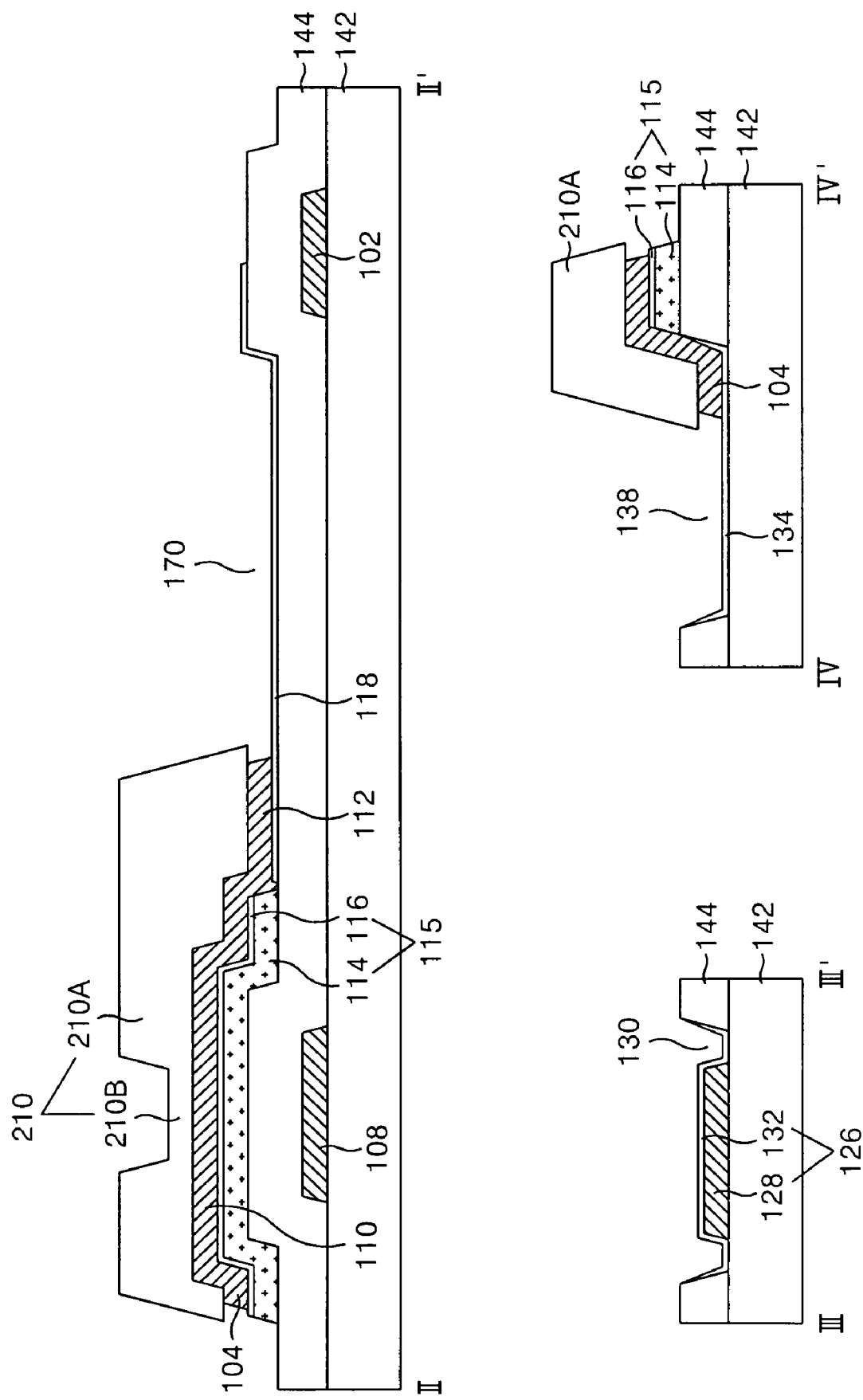

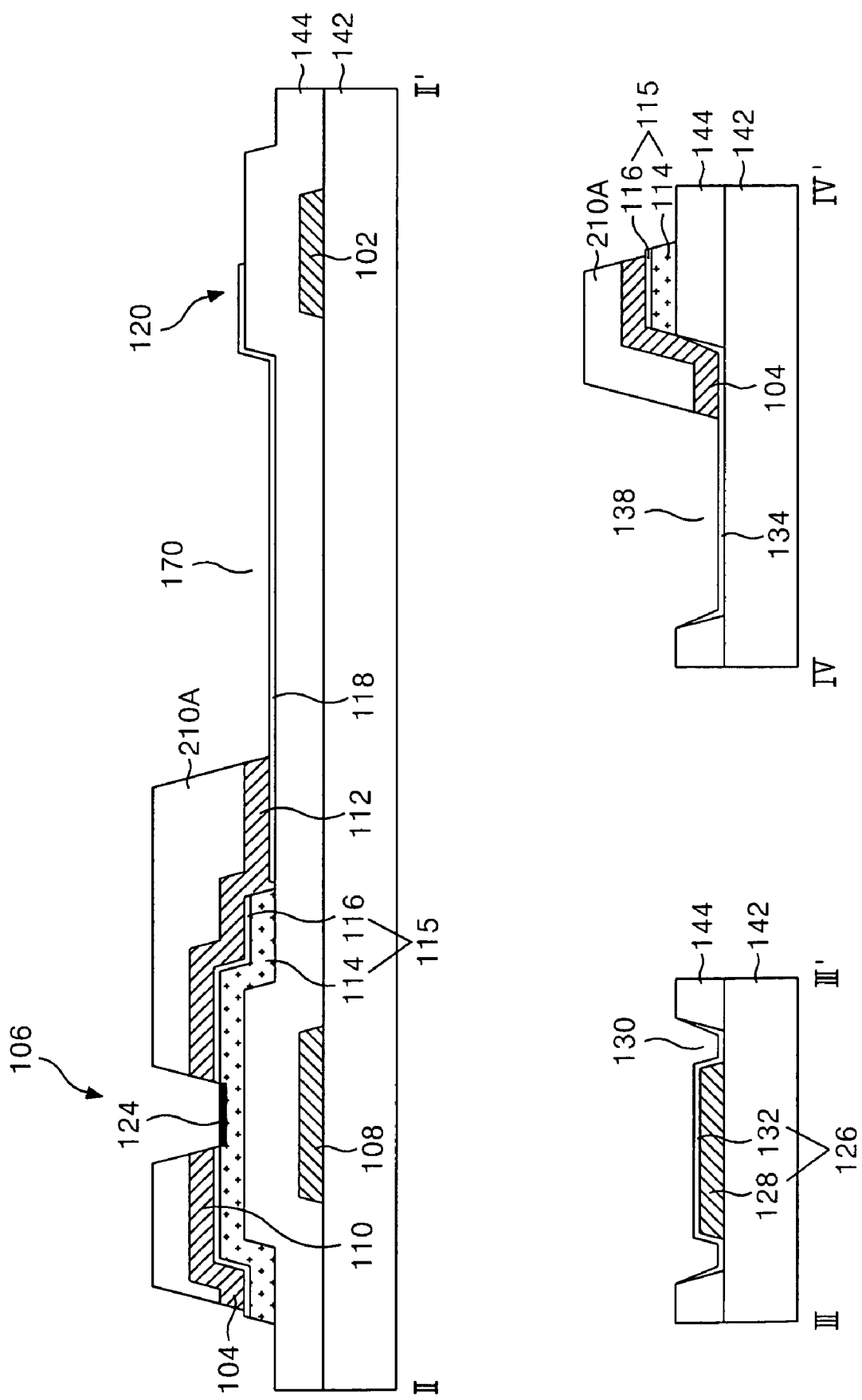

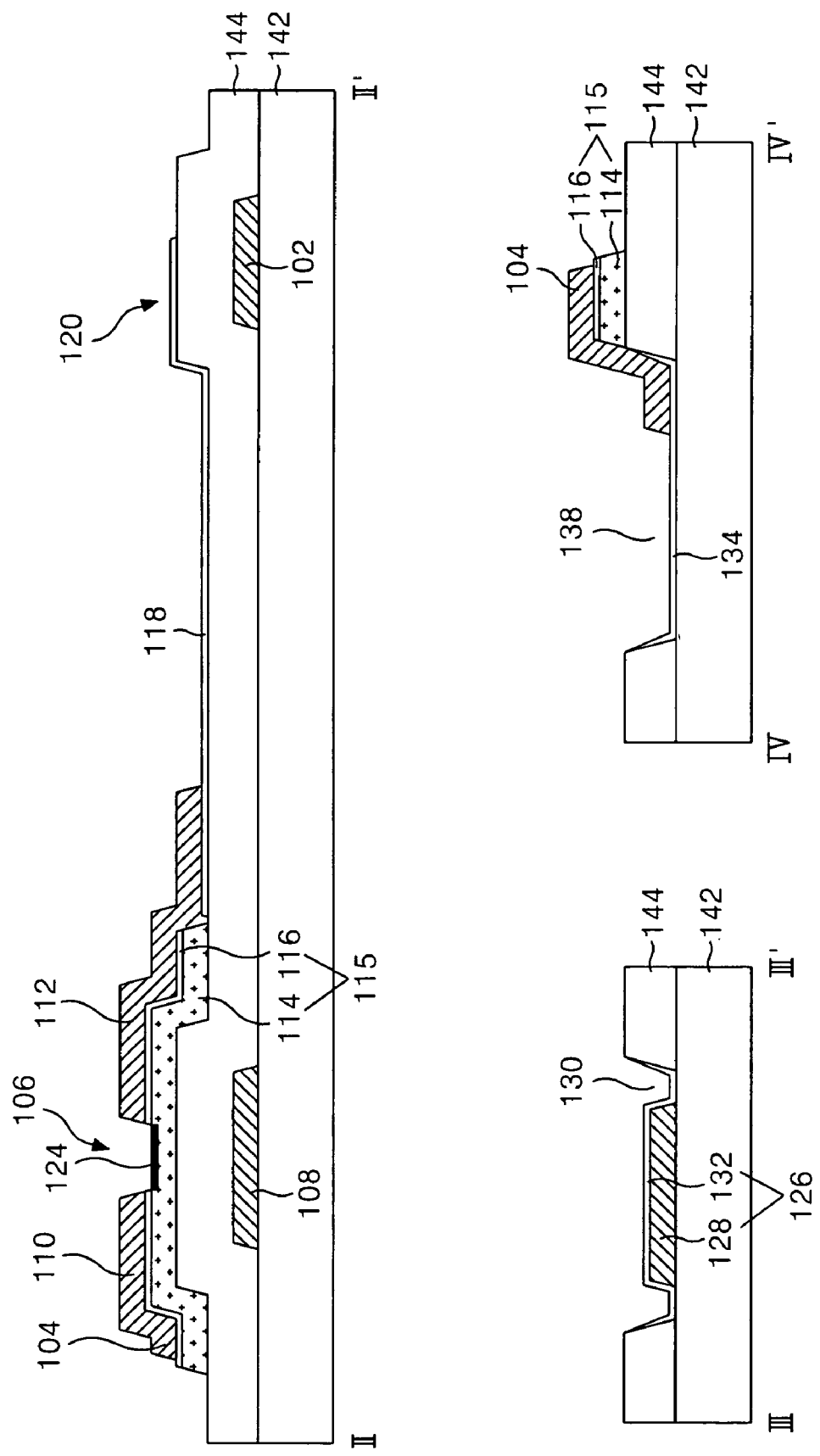

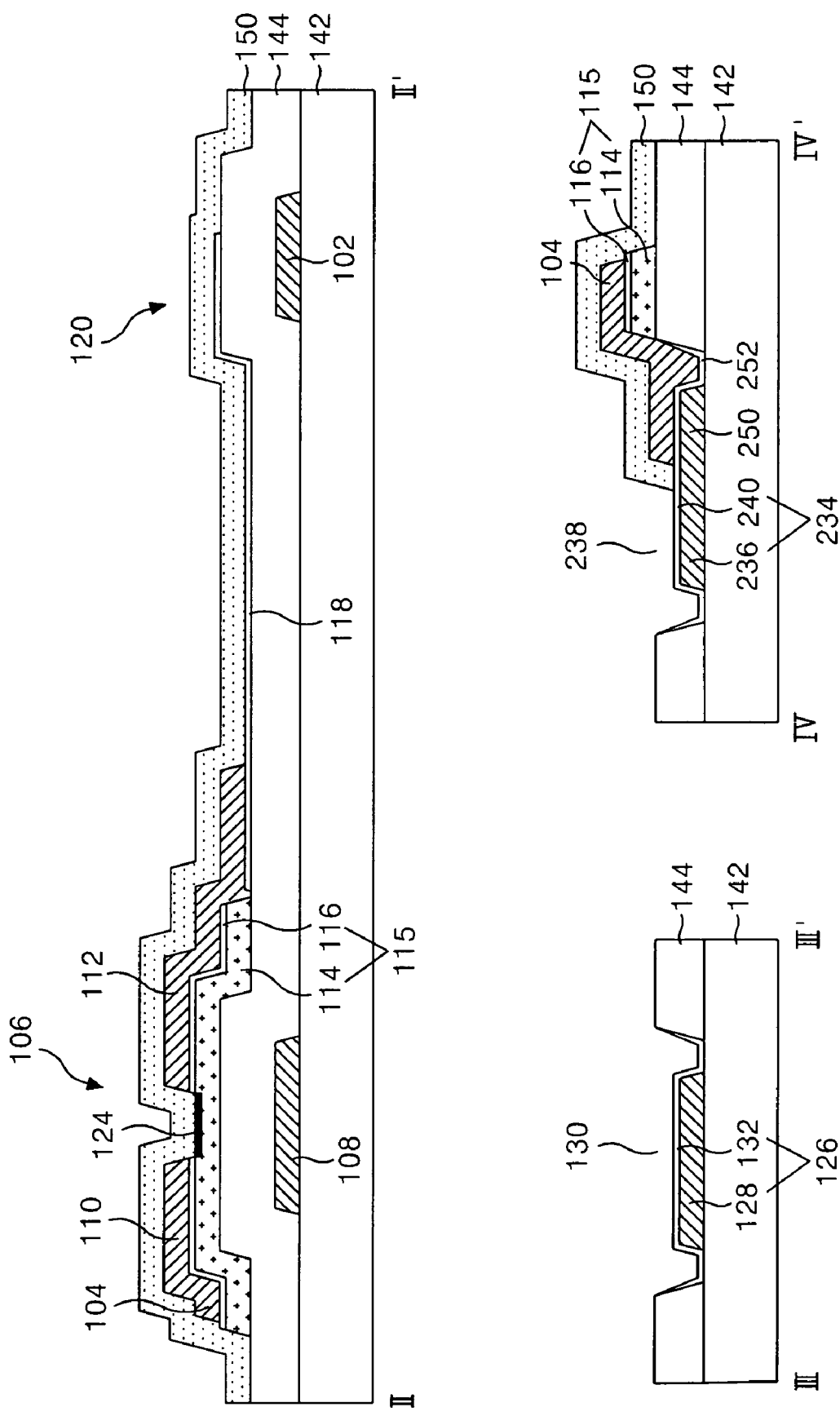

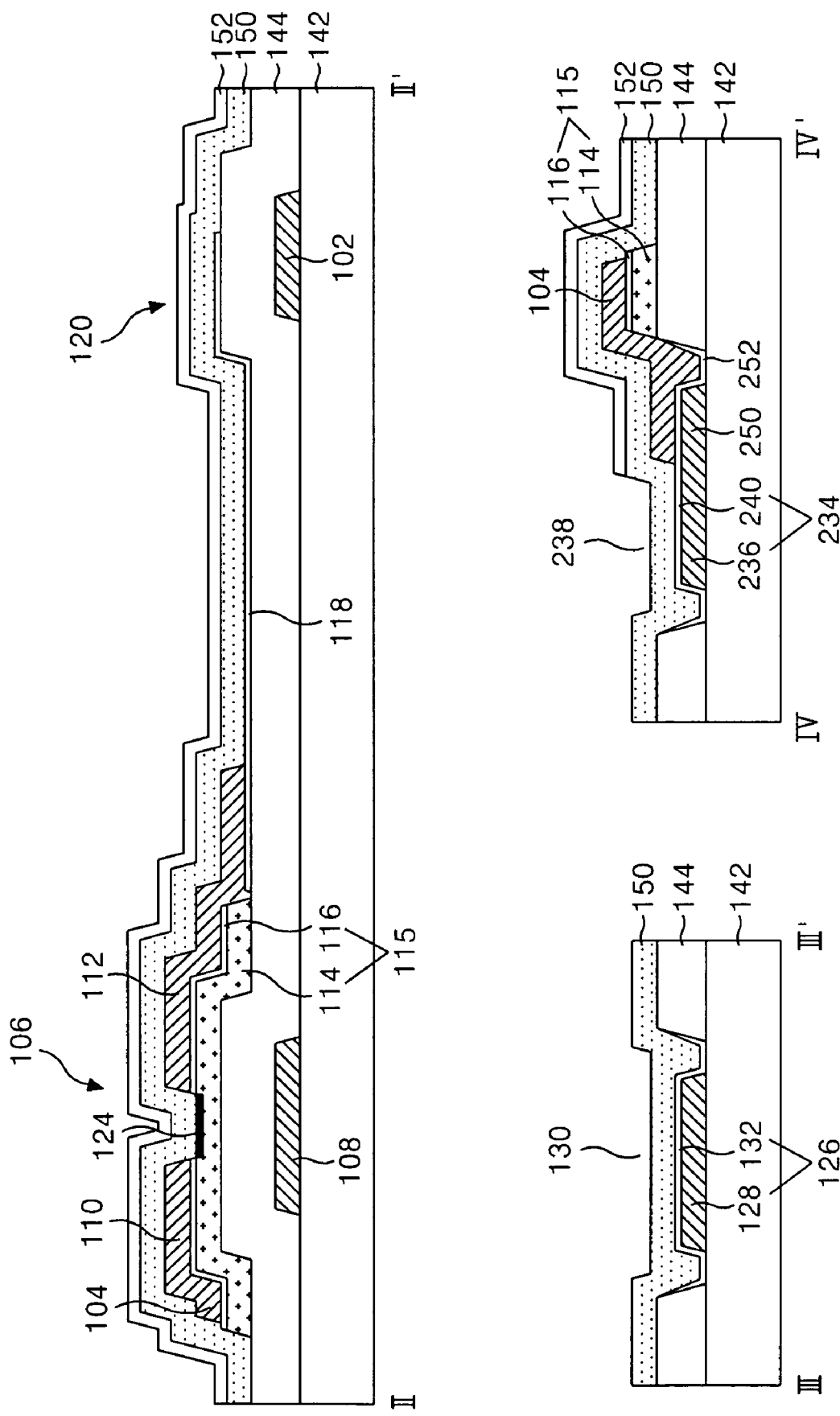

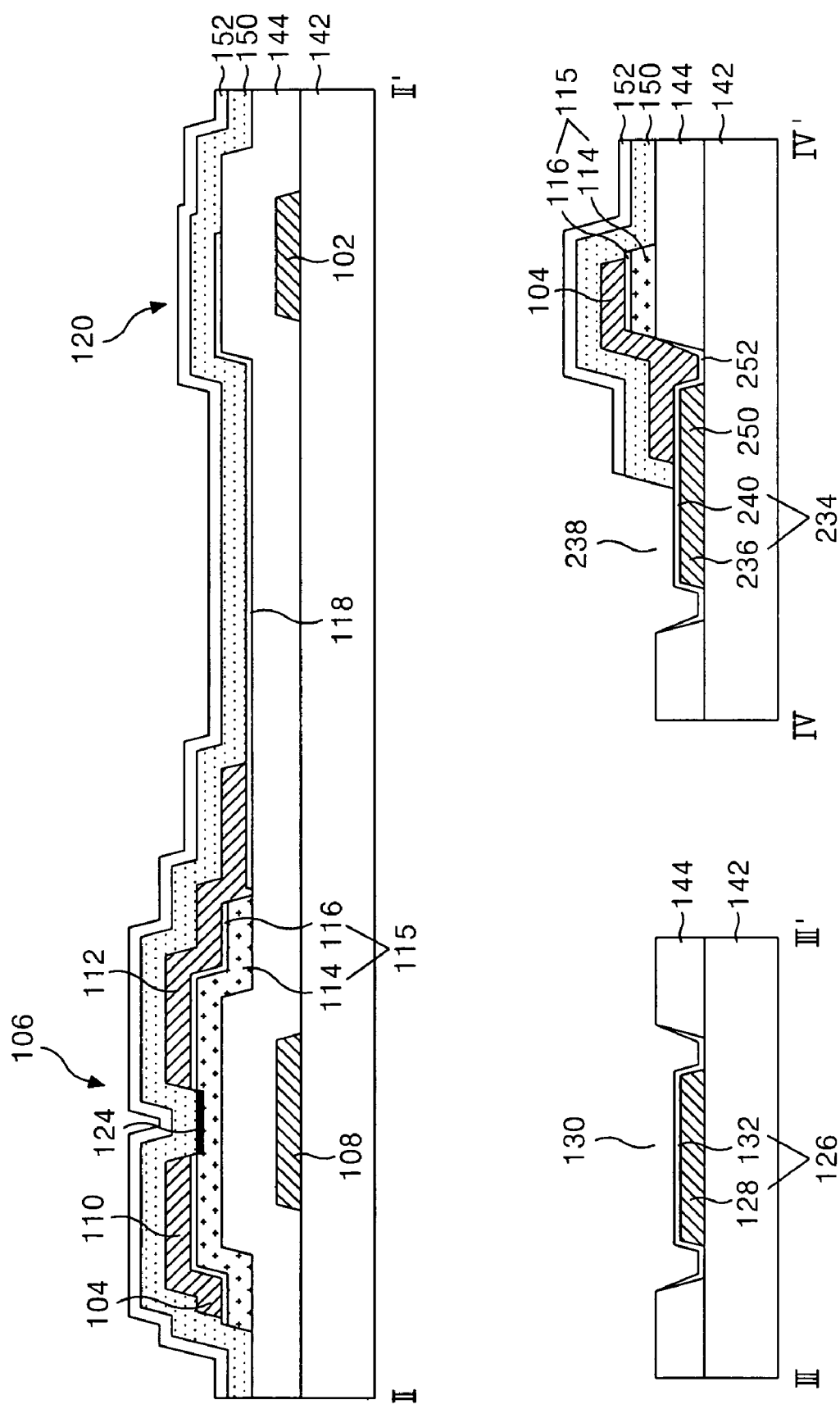

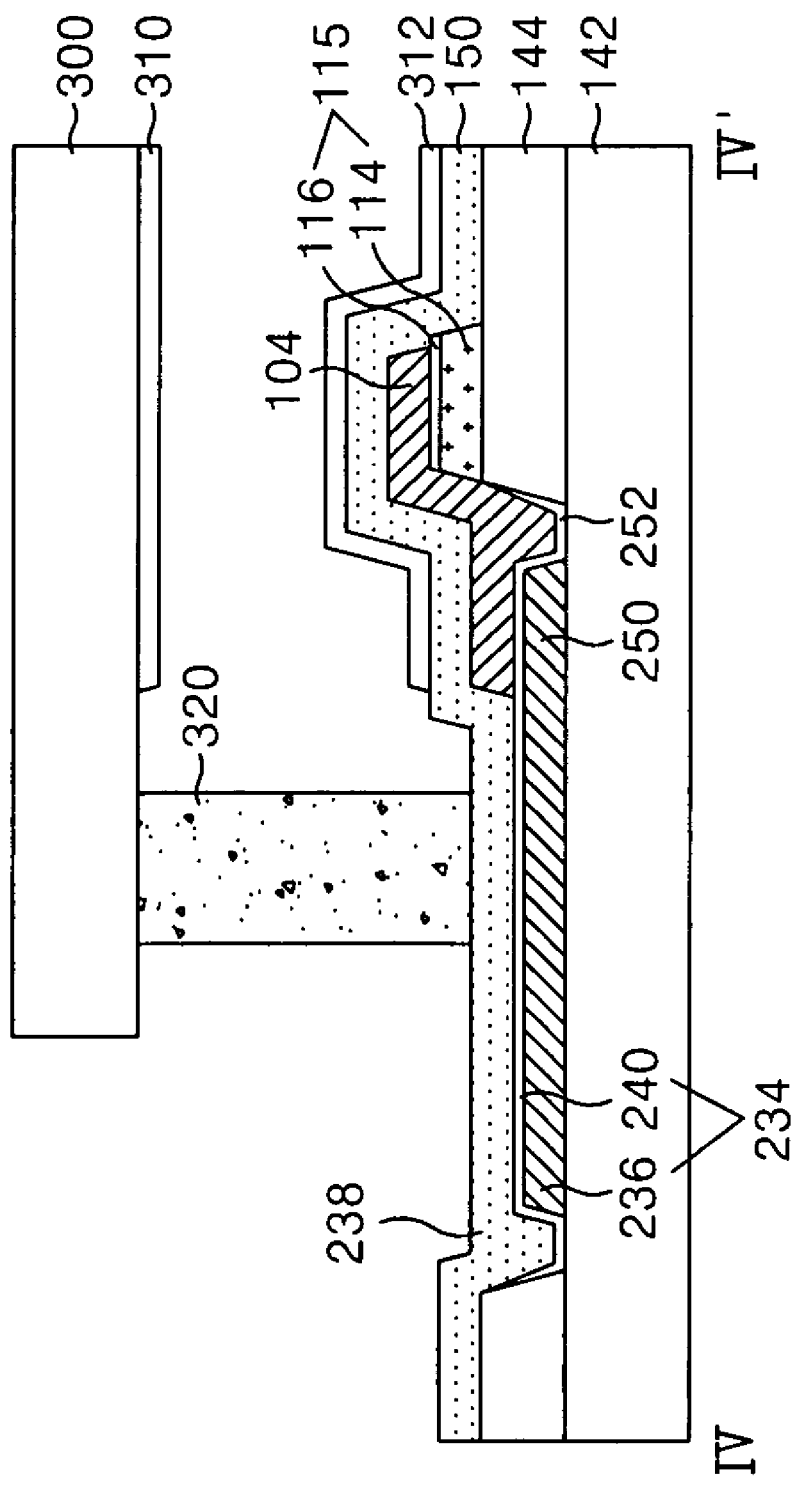

THIN FILM TRANSISTOR SUBSTRATE AND FABRICATING METHOD THEREOF, LIQUID CRYSTAL DISPLAY PANEL USING THE SAME AND FABRICATING METHOD THEREOF

This is a divisional of U.S. patent application Ser. No. 11/167,097, filed Jun. 28, 2005, now U.S. Pat. No. 7,580,106 which claims the benefit of Korean Patent Application No. P2004-118602 filed in Korea on Dec. 31, 2004, all of which are hereby incorporated by reference for all purposes as if fully set forth herein.

BACKGROUND OF THE INVENTION

1. Field of the Invention

This invention relates to a thin film transistor substrate applied to a display device, and more particularly to a thin film transistor substrate and a fabricating method thereof that is adaptive for simplifying the fabrication process. Also, the present invention is directed to a liquid crystal display panel employing the thin film transistor substrate and a fabricating method thereof that is adaptive for simplifying the fabrication process.

2. Description of the Related Art

Generally, a liquid crystal display (LCD) controls the light transmittance of a liquid crystal having a dielectric anisotropy using an electric field to thereby display a picture. To this end, the LCD includes a liquid crystal display panel for displaying a picture using a liquid crystal cell matrix and a driving circuit to drive the liquid crystal display panel.

Referring to FIG. 1, a related art liquid crystal display panel includes a color filter substrate 10 and a thin film transistor substrate 20 that are joined to each other having a liquid crystal 24 therebetween.

The color filter substrate 10 includes a black matrix 4, a color filter 6 and a common electrode 8 that are sequentially provided on an upper glass substrate 2. The black matrix 4 is provided in a matrix on the upper glass substrate 2. The black matrix 4 divides an area of the upper glass substrate 2 into a plurality of cell areas containing the color filters 6 and prevents light interference between adjacent cells and external light reflections. The color filters 6 are placed in the cell area defined by the black matrix 4, with adjacent cells alternating between red(R), green(G) and blue(B) filters, thereby transmitting red, green and blue light. The common electrode 8 is formed from a transparent conductive layer entirely coated onto the color filter 6, and supplies a common voltage Vcom that serves as a reference voltage for driving of the liquid crystal 24. Further, an over-coat layer (not shown) to smooth the color filter 6 may be provided between the color filter 6 and the common electrode 8.

The thin film transistor substrate 20 includes a thin film transistor 18 and a pixel electrode 22 provided for each cell defined by a gate line 14 crossing a data line 16 on a lower glass substrate 12. The thin film transistor 18 applies a data signal from the data line 16 to the pixel electrode 22 in response to a gate signal from the gate line 14. The pixel electrode 22 formed from a transparent conductive layer supplies a data signal from the thin film transistor 18 to drive the liquid crystal 24.

The liquid crystal 24 having a dielectric anisotropy is rotated by an electric field formed by a data signal on the pixel electrode 22 and a common voltage Vcom on the common electrode 8 to control the light transmittance of the liquid crystal 24, thereby implementing a gray scale level.

Further, the liquid crystal display panel may include a spacer (not shown) to fix a cell gap between the color filter substrate 10 and the thin film transistor substrate 20.

In the liquid crystal display panel, the color filter substrate 10, and the thin film transistor substrate 20 are formed by a plurality of mask processes. One mask process includes a number of processes such as thin film deposition (coating), cleaning, photolithography, etching, photo-resist stripping and inspection processes, etc.

Because the fabrication of the thin film transistor substrate includes semiconductor fabricated processes and requires a plurality of mask processes, the manufacturing cost the liquid crystal display panel increases because of the complexity of the manufacturing processes. Therefore, the thin film transistor substrate of the present invention has been developed to reduce the number of mask processes.

SUMMARY OF THE INVENTION

Accordingly, the present invention is directed to a thin film transistor substrate and fabricating method thereof, liquid crystal display panel using the same and fabricating method thereof that substantially obviates one or more of the problems due to limitations and disadvantages of the related art.

An advantage of the present invention is to provide a thin film transistor substrate and a fabricating method thereof; and a liquid crystal display panel employing the same and a fabricating method thereof that are adaptive to simplifying the fabrication process.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate, including: a gate line on a substrate; a data line crossing the gate line having a gate insulating film therebetween to define a pixel area; a pixel hole in the pixel area; a pixel electrode made of a transparent conductive film on the gate insulating film in the pixel hole in the pixel area; and a thin film transistor including a gate electrode connected to the gate line, a source electrode connected to the data line, a drain electrode connected to the pixel electrode, and a semiconductor layer defining a channel between the source electrode and the drain electrode, wherein the semiconductor layer overlaps with a source/drain metal pattern including the data line, the source electrode, and the drain electrode; wherein the drain electrode protrudes from the semiconductor layer toward an upper portion of the pixel electrode, and the drain electrode connects to the pixel electrode; and wherein the semiconductor layer is removed from where it overlaps the transparent conductive film.

In another aspect of the present invention, a method of fabricating a thin film transistor substrate, comprising: a first mask process of forming a gate line and a gate electrode connected to the gate line on a substrate; a second mask process including forming a gate insulating film covering the gate line and the gate electrode and a semiconductor layer, then defining a pixel hole that passes through the semiconductor layer in a pixel area, and forming a pixel electrode on the gate insulating film within the pixel hole; and a third mask process including forming a source/drain metal pattern including a data line crossing the gate line to define the pixel area, a source electrode connected to the data line, and a drain electrode connected to the pixel electrode on the substrate, and exposing an active layer of the semiconductor pattern to define a channel between the source electrode and the drain electrode.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3A and FIG. 3B are section views of the thin film transistor substrate taken along the II-II', III-III' and IV-IV' lines in FIG. 2;

FIG. 5A and FIG. 5B are a plan view and a section view, respectively, for explaining a first mask process in a method of fabricating the thin film transistor substrate according to the embodiment of the present invention;

FIG. 7A to FIG. 7D are section views for specifically explaining the second mask process;

FIG. 8A and FIG. 8B are a plan view and a section view, respectively, for explaining a third mask process in a method of fabricating the thin film transistor substrate according to the embodiment of the present invention;

FIG. 9A to FIG. 9D are section views for specifically explaining the third mask process;

FIG. 15 is a section view of the thin film transistor substrate taken along the II-II', III-III' and IV-IV' lines in FIG. 14;

FIG. 16A and FIG. 16B are section views for explaining a method of fabricating a protective film according to another embodiment of the present invention; and FIG. 17A and FIG. 17B are section views for explaining a fabricating method of the protective film in a method of fabricating the liquid crystal display panel employing the thin film transistor substrate according to the embodiment of the present invention.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 2 to 17B.

Figure 1:
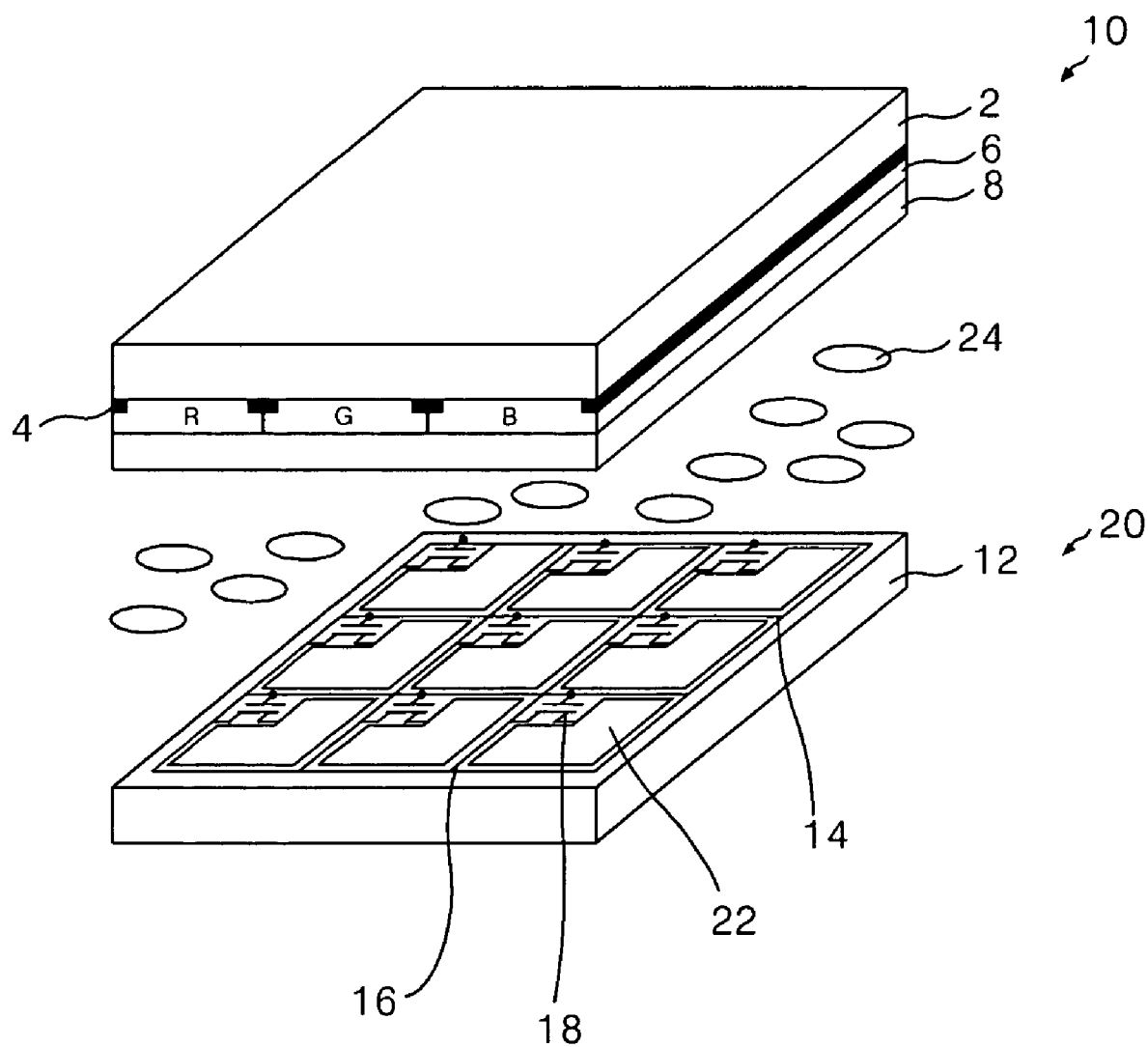
FIG. 1 is a schematic perspective view showing a structure of a related art liquid crystal display panel.
Figure 2:
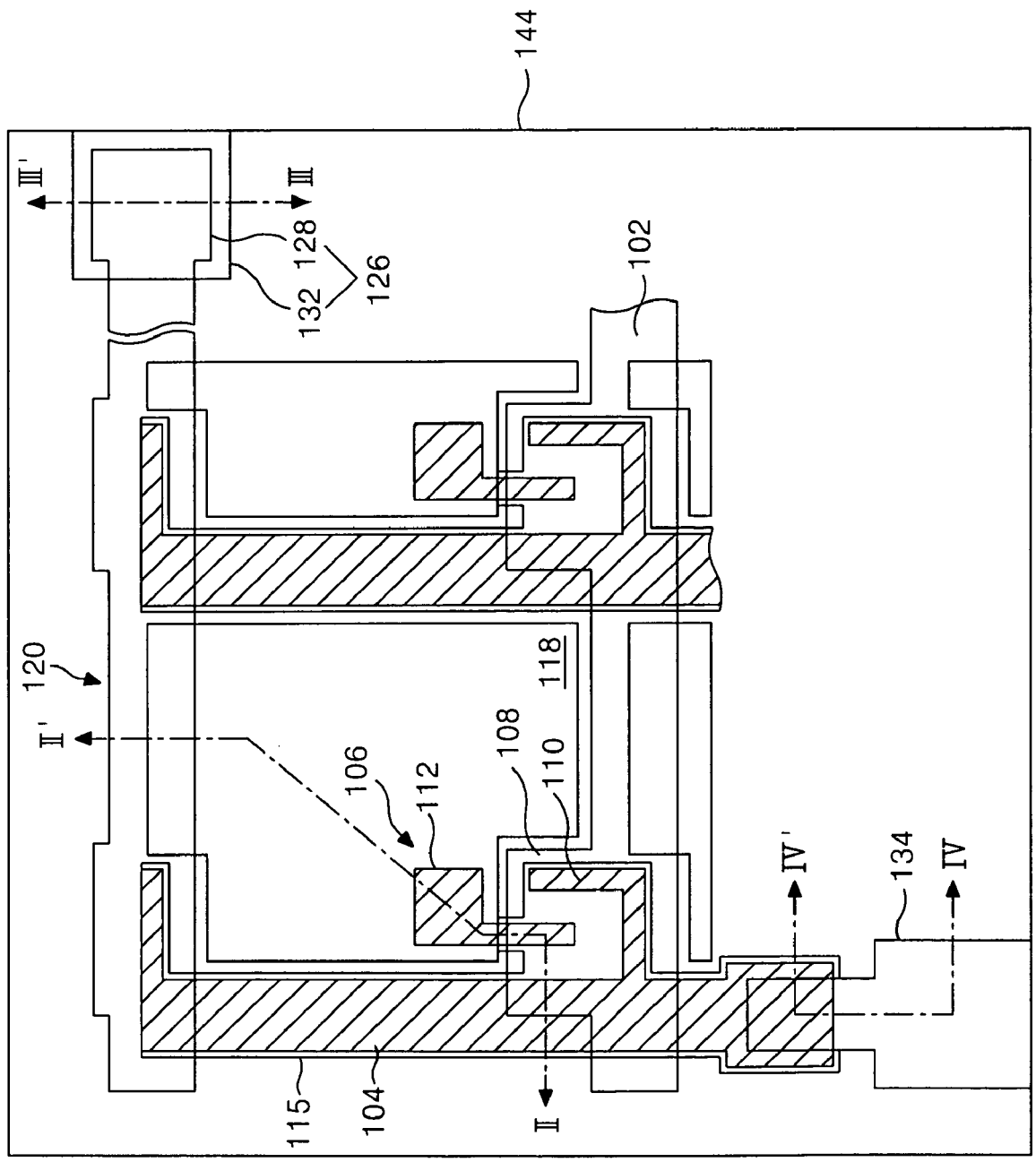
FIG. 2 is a plan view showing a portion of a thin film transistor substrate according to a first embodiment of the present invention.

FIG. 2 is a plan view showing a portion of a thin film transistor substrate according to a first embodiment of the present invention, and FIG. 3A and FIG. 3B are section views of the thin film transistor substrate taken along the II-II', III-III' and IV-IV' lines in FIG. 2.

Referring to FIG. 2 and FIG. 3, the thin film transistor substrate includes a gate line 102 and a data line 104 on a lower substrate 142 in such a manner to cross each other with a gate insulating film 144 therebetween, a thin film transistor 106 connected to the gate line 102 and the data line 104 near each crossing, and a pixel electrode 118 in a pixel area defined by the crossing structure. Further, the thin film transistor substrate includes a storage capacitor 120 provided at an overlapped portion between the pixel electrode 118 and the gate line 102, a gate pad 126 connected to the gate line 102, and a data pad 134 connected to the data line 104.

The thin film transistor 106 allows a pixel signal applied to the data line 104 to be charged onto the pixel electrode 118 and stored in response to a scanning signal applied to the gate line 102. To this end, the thin film transistor 106 includes a gate electrode 108 connected to the gate line 102, a source electrode 110 connected to the data line 104, a drain electrode 112 positioned in opposition to the source electrode 110 to be connected to the pixel electrode 118, an active layer 114 overlapping with the gate electrode 108 with having the gate insulating film 144 therebetween to provide a channel between the source electrode 110 and the drain electrode 112, and an ohmic contact layer 116 formed on the active layer 114 except in the channel region to make an ohmic contact with the source electrode 110 and the drain electrode 112.

Further, a semiconductor layer 115 including the active layer 114 and the ohmic contact layer 116 overlaps the data line 104.

In a pixel area defined by the crossing of the gate line 102 and the data line 104, the pixel electrode 118 is on the gate insulating film 144. Further, the pixel electrode 118 connects to the thin film transistor 106 through the drain electrode 112 that protrudes from the semiconductor layer 115 toward the upper portion of the pixel electrode 118. The pixel electrode 118 stores a pixel signal supplied from the thin film transistor 106 as a charge to generate a potential difference with respect to a common electrode on a color filter substrate (not shown). This potential difference rotates a liquid crystal positioned between the thin film transistor substrate and the color filter substrate due to a dielectric anisotropy and controls the amount of a light from a light source (not shown) passing through the liquid crystal and the color filter substrate.

The storage capacitor 120 is formed such that the pixel electrode 118 overlaps with a portion of the pre-stage gate line 102 with the gate insulating film 144 therebetween. The storage capacitor 120 allows a pixel signal charged in the pixel electrode 118 to be stably maintained.

The gate line 102 receives a scanning signal from a gate driver via the gate pad 126. The gate pad 126 consists of a lower gate pad electrode 128 extended from the gate line 102, and an upper gate pad electrode 132 provided within a first contact hole 130 passing through the gate insulating film 144 to connect to the lower gate pad electrode 128. The upper gate pad electrode 132, along with the pixel electrode 118, is formed from a transparent conductive layer, and makes an interface with the edge of the gate insulating film 144 enclosing the first contact hole 130.

The data line 104 receives a pixel signal from a data driver via a data pad 134. As shown in FIG. 3, the data pad 134 is formed from a transparent conductive layer within a second contact hole 138 passing through the gate insulating film 144 along with the upper gate pad electrode 132. The second contact hole 138 of the data pad 134 extends to overlap with a portion of the data line 104. The data pad 134 makes an interface with the edge of the gate insulating film 144 enclosing the second contact hole 138. The data line 104 protrudes from the semiconductor layer 115 into the second contact hole 138 to connect to the extended portion of the data pad 134. Otherwise, as shown in FIG. 3, the data pad 134 is formed from a transparent conductive layer on the gate insulating film 144, and extends to overlap with the data line 104. Thus, the data line 104 protrudes from the semiconductor layer 115 towards the data pad 134.

Figure 4:
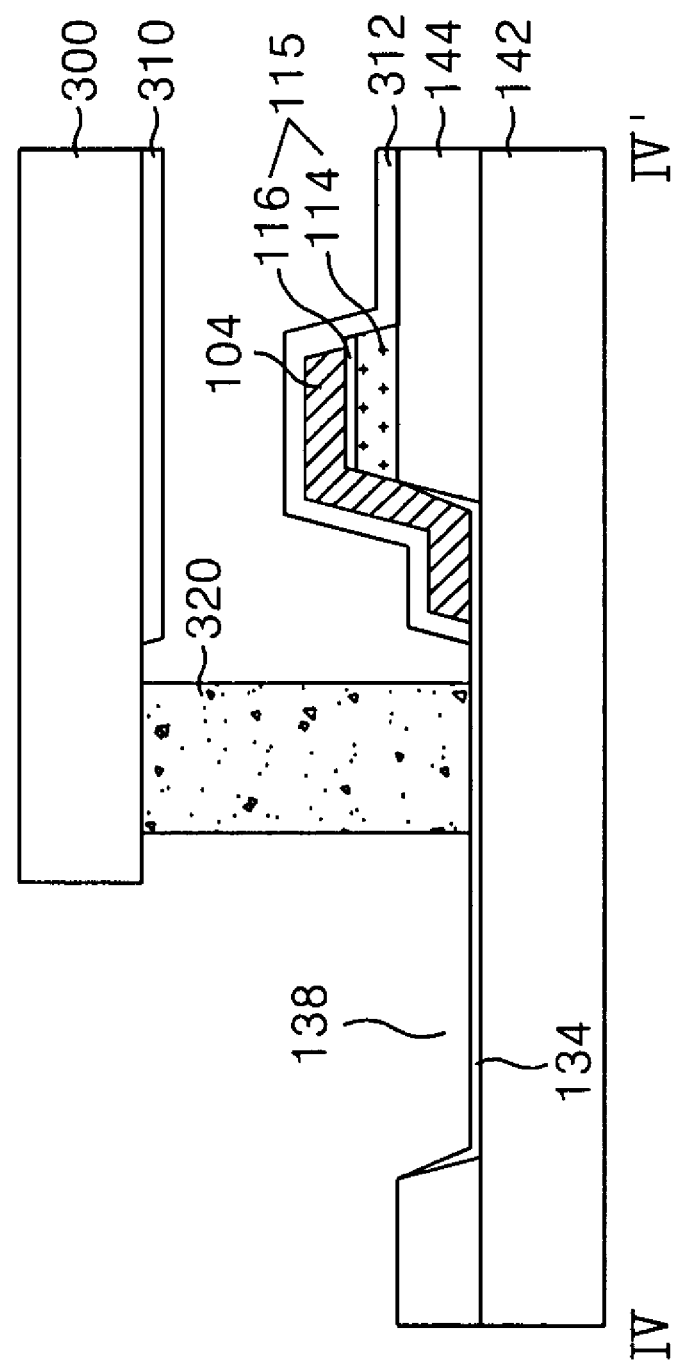
FIG. 4 is a section view showing a data pad area of a liquid crystal display panel employing the thin film transistor substrate shown in FIG. 3.

In this case, the data line 104 is exposed due to an absence of the protective film. In order to prevent the data line 104 from being exposed and oxidized, as shown in FIG. 4, the extended portion of the data pad 134 and the connecting portion of the data line 104 are positioned within an area sealed by a sealant 320. The data line 104 in the sealed area is coated with a lower alignment film 312, thereby protecting the data line 104 from oxidation thereon.

Referring to FIG. 4, a thin film transistor substrate coated with the lower alignment film 312 and a color filter substrate 300 coated with an upper alignment film 310 are joined to each other by the sealant 320, and a cell gap between two substrates sealed by the sealant 320 is filled with a liquid crystal. The upper and lower alignment films 310 and 312 are coated with an organic insulating material in a picture display area of the two substrates. The sealant 320 is placed so as to not be in contact with the upper and lower alignment films 310 and 312 so as to have better adhesion to the two substrates. Thus, the data line 104 provided at the thin film transistor substrate, along with the source electrode 110 and the drain electrode 112, is positioned in an area sealed by the sealant 320, so that it can be sufficiently protected by the lower alignment film 312 as well as by the liquid crystal filled in the sealed area.

As described above, in the thin film transistor substrate according to the first embodiment of the present invention, a transparent conductive pattern including the pixel electrode 118, the upper gate pad electrode 132 and the data pad 140 is formed by an etching process using a photo-resist pattern to define the contact holes 130 and 138 passing through the gate insulating film 144. Thus, the transparent conductive pattern is provided on the gate insulating film 144, or within the corresponding hole in order to make an interface with the gate insulating film 144.

Further, the semiconductor layer 115 is formed like the gate insulating film 144 and then has an exposed portion removed upon formation of a source/drain metal pattern including the data line 104, the source electrode 110 and the drain electrode 112. Further, upon formation of the source/drain metal pattern, the active layer 114 is exposed to define a channel of the thin film transistor 106. Thus, the semiconductor layer 115 has a channel formed only where a transparent conductive pattern does not exist between the source electrode 110 and the drain electrode 112 and the overlapping area between the source/drain metal pattern and the gate insulating film 144. This is because the transparent conductive pattern is formed where the semiconductor layer 115 is removed. A surface layer 124 of the exposed active layer 114 is subject to a surface treatment by plasma, so that the active layer 114 of the channel may be protected by the surface layer 124 oxidized by $SiO_2$.

The thin film transistor substrate according to the first embodiment of the present invention having the above-mentioned structure may be formed by the following three-round mask process.

Figure 5B:
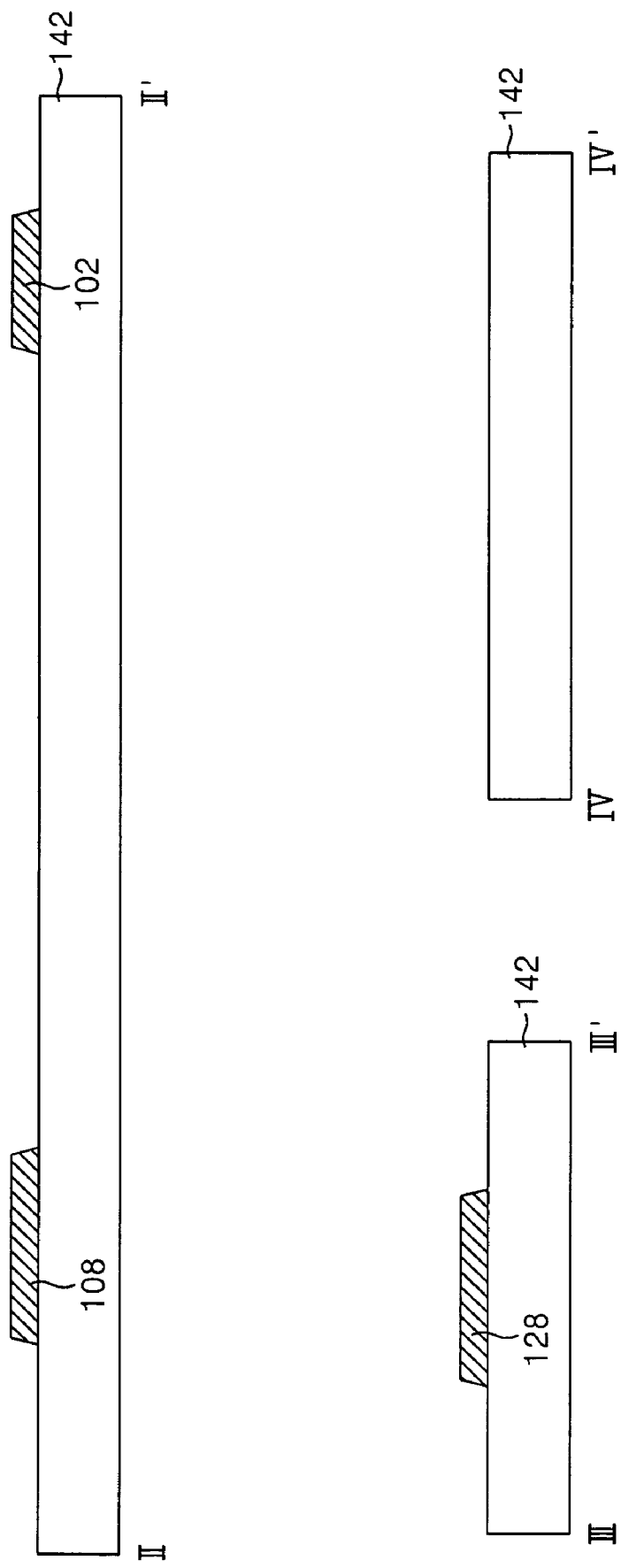

FIG. 5A and FIG. 5B are a plan view and a section view, respectively, for explaining a first mask process in a method of fabricating the thin film transistor substrate according to an embodiment of the present invention.

A gate metal pattern including the gate line 102, the gate electrode 108 connected to the gate line 102, and the lower gate pad electrode 128 is formed on the lower substrate 142 by the first mask process.

More specifically, a gate metal layer is formed on the lower substrate 142 by a deposition technique such as the sputtering, etc. The gate metal layer employs a single layer made from a metal material such as Mo, Ti, Cu, AlNd, Al, Cr, a Mo alloy, a Cu alloy or an Al alloy, etc., or takes a stacked structure of at least double layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu-alloy/Mo, Cu-alloy/Al, Cu-alloy/Mo-alloy, Cu-alloy/Al-alloy, Al/Mo alloy, Mo-alloy/Al, Al-alloy/Mo-alloy, Mo-alloy/Al-alloy, Mo/Al alloy, Cu/Mo alloy or Cu/Mo(Ti), etc. Then, the gate metal layer is patterned by photolithography and an etching process using a first mask to thereby produce the gate metal pattern including the gate line 102, the gate electrode 108, and the lower gate pad electrode 128.

Figure 6A:
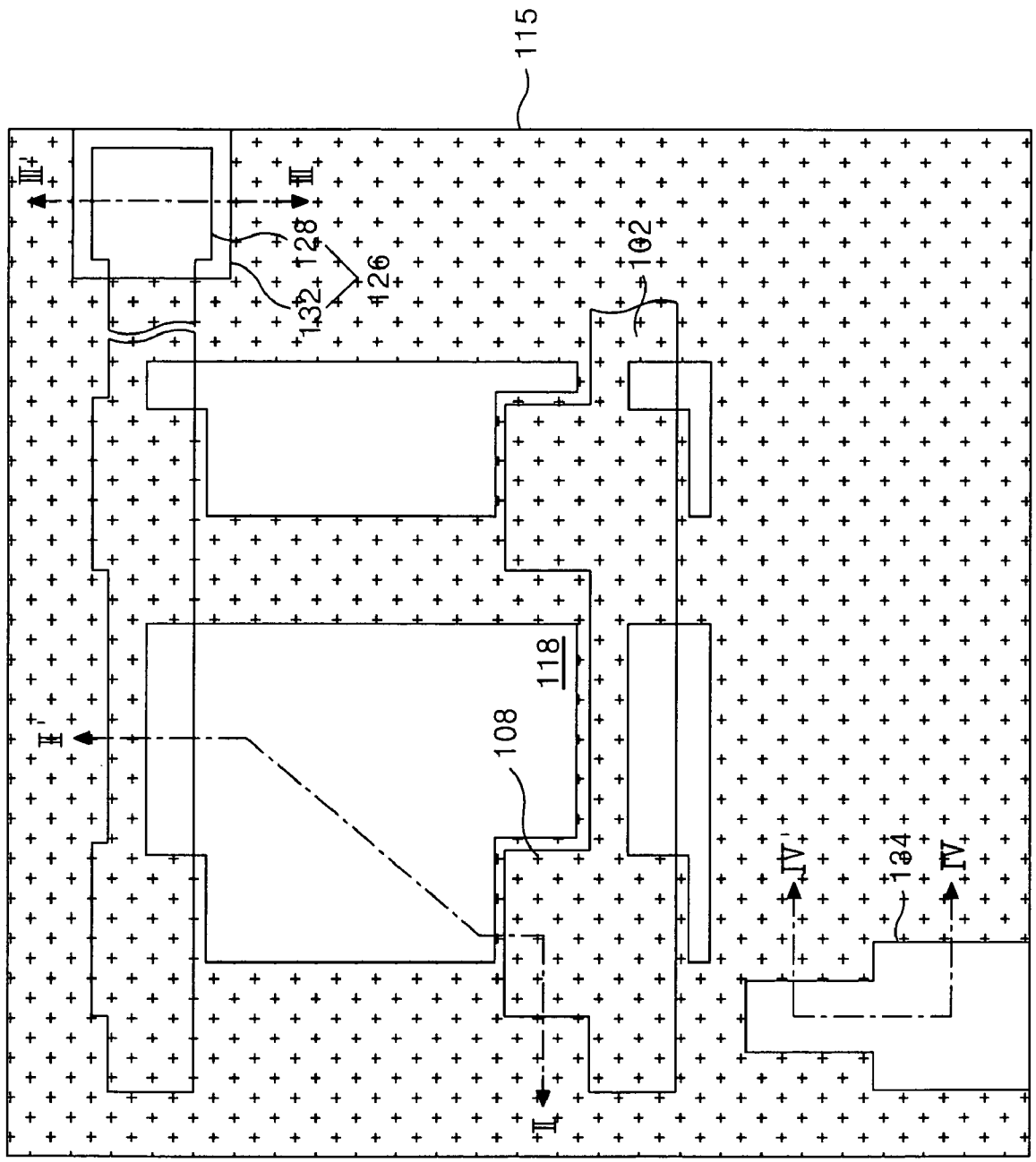
FIG. 6A and FIG. 6B are a plan view and a section view, respectively, for explaining a second mask process in a method of fabricating the thin film transistor substrate according to the embodiment of the present invention.
Figure 6B:
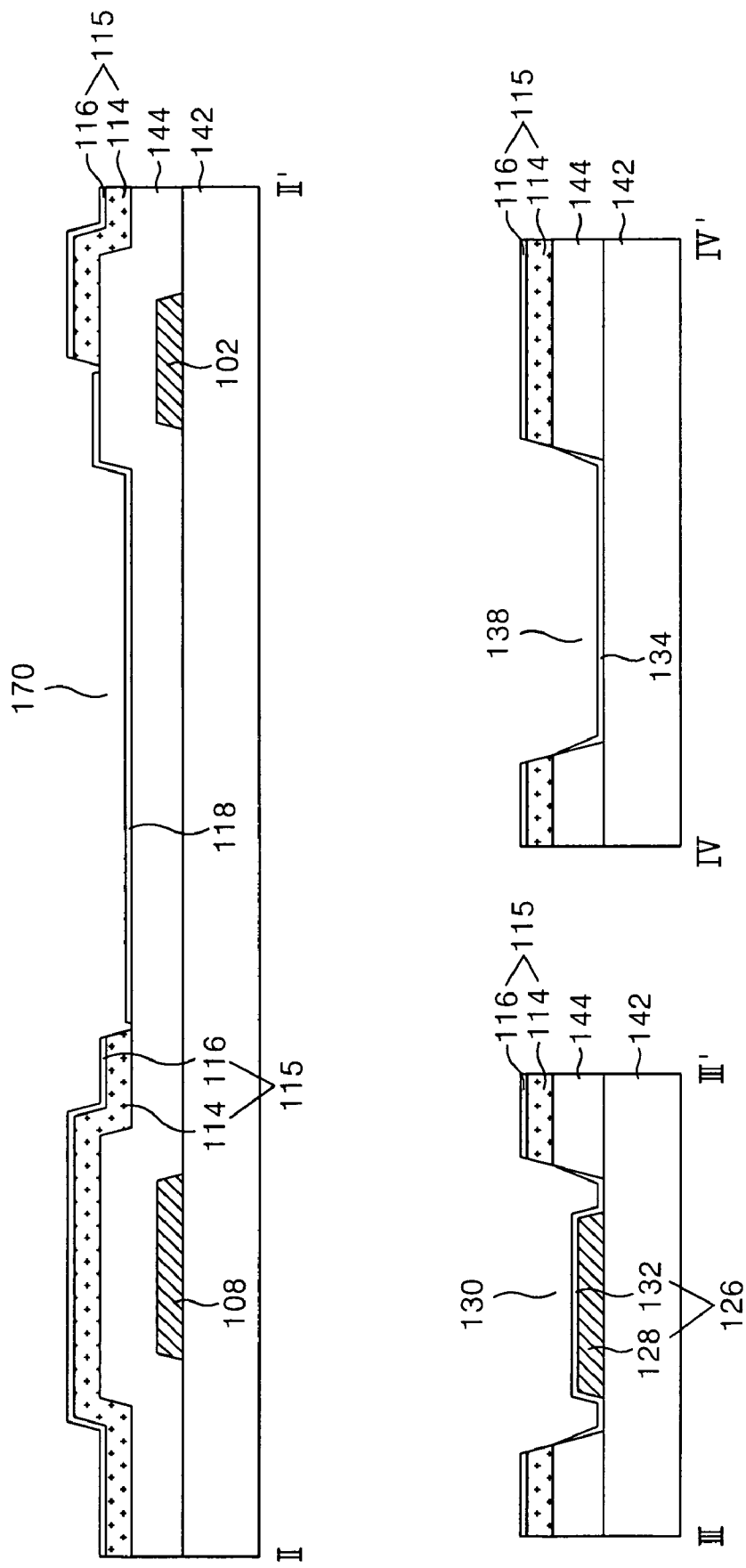

FIG. 6A and FIG. 6B are a plan view and a section view, respectively, for explaining a second mask process in a method of fabricating the thin film transistor substrate according to the embodiment of the present invention and FIG. 7A to FIG. 7C are section views for specifically explaining the second mask process.

The gate insulating film 144 and the semiconductor layer 115 including the active layer 114 and the ohmic contact layer 116 are disposed on the lower substrate 142 including the gate metal pattern. A pixel hole 170 and the first and second contact holes 130 and 138 passing through the semiconductor layer 115 and the gate insulating film 144 are defined by the second mask process. Further, a transparent conductive pattern including the pixel electrode 118, the upper gate pad electrode 132, and the data pad 134 is formed within the corresponding holes. The pixel hole 170 and the first and second contact holes 130 and 138 have different depths that are defined by a single mask process employing a partial transmitting mask such as a diffractive exposure mask or a half tone mask, etc.

Referring to FIG. 7A, the gate insulating film 144 and the semiconductor layer 115 including the active layer 114 and the ohmic contact layer 116 are sequentially disposed on the lower substrate 142 including the gate metal pattern by a deposition technique such as the PECVD, etc. Herein, the gate insulating film 144 is formed from an inorganic insulating material such as silicon nitride (SiNx) or silicon oxide (SiOx), whereas the active layer 114 and the ohmic contact layer 116 are formed from an amorphous silicon or an amorphous silicon doped with an n+ or p+ impurity.

Subsequently, a first photo-resist pattern 200 including photo-resist patterns 200A and 200B having a different thickness is formed on the ohmic contact layer 116 by the photolithography using a partial transmitting mask. The partial transmitting mask includes a shielding portion that shields the ultraviolet rays, a partial transmitting portion that diffracts the ultraviolet rays using a slit pattern or partially transmits the ultraviolet ray using a phase-shifting material, and a full transmitting portion that fully transmits the ultraviolet rays. The first photo-resist pattern 200 including a different thickness of photo-resist patterns 200A and 200B and an aperture portion is formed by using photolithography with the partial transmitting mask. In this case, a relatively thick photo-resist pattern 200A is provided at a shielding area P1 overlapping the shielding portion of the partial transmitting mask; the photo-resist pattern 200B that is thinner than the photo-resist pattern 200A is provided at a partial exposure area P2 overlapping with the partial transmitting portion; and the aperture portion is provided at an full exposure area P3 overlapping the full transmitting part.

Referring to FIG. 7B, the pixel hole 170 and first and second contact holes 130 and 138 passing through the semiconductor layer 115 and through the gate insulating film 144 are formed by the etching process using the first photo-resist pattern 200.

For instance, the semiconductor layer 115 and the gate insulating film 144 exposed through the first photo-resist pattern 200 are etched by a dry etching process to thereby define the first and second contact holes 130 and 138. In this case, the first photo-resist pattern 200 also is ashed by a dry etching process, so that the photo-resist pattern 200A is thinned and the photo-resist pattern 200B, along with the semiconductor pattern 115 under it, is removed, thereby defining the pixel hole 170. Particularly, the semiconductor pattern 115 and the gate insulating film 144 are over-etched in comparison to the ashed photo-resist pattern 200A by an isotropic dry etching technique. Thus, the edges of the pixel hole 170 and the first and second contact holes 130 and 138 are positioned under the edge of the ashed photo-resist pattern 200A.

Alternatively, the first and second contact holes 130 and 138 are formed by the dry etching process using the first photo-resist pattern 200, and then the thickness of the photo-resist pattern 200A is reduced and the photo-resist pattern 200B is removed by the ashing process. Next, the pixel hole 170 passing through the semiconductor layer 115 is formed by a wet etching process using the ashed photo-resist pattern 200A. In this case, an etching rate of the semiconductor layer 115 is larger than that of the gate insulating film 144, so that the semiconductor layer 115 is over-etched in comparison to the ashed photo-resist pattern 200A.

Accordingly, the pixel hole 170 exposes the gate insulating film 144; the second contact hole 138 exposes the substrate 142; and the first contact hole 130 exposes the lower gate pad electrode 128 and the substrate 142 at its edges. The first contact hole 130 may be formed so as to expose only the lower gate pad electrode 128. On the other hand, when the second contact hole 138 is formed by the partial exposure mask like the pixel hole 170, the second contact hole 138 may have a structure in which the semiconductor layer 115 is passed through to expose the gate insulating film 144.

Referring to FIG. 7C, the transparent conductive layer 117 is entirely formed on the substrate 142 provided with the photo-resist pattern 200A by a deposition technique such as the sputtering, etc. The transparent conductive layer 117 is made from ITO, TO, IZO or ITZO, etc. Thus, the pixel electrode 118 is formed within the pixel hole 170; the upper gate pad electrode 132 is formed within the first contact hole 130; and the data pad 134 is formed within the second contact hole 138. This transparent conductive pattern leaves an opening at the edge of the photo-resist pattern 200A near the edges of the pixel hole 170 and the first and second contact holes 130 and 138. Further, the pixel electrode 118 encloses the pixel hole 170, whereas the upper gate pad electrode 132 and the data pad 134 are formed within the first and second contact holes 130 and 138 in contact with the gate insulating film 144. When the second contact hole 138 only passes through the semiconductor layer 115 using a partial exposure, the data pad 134 is on the gate insulating film 144 so as to be in contact with or spaced from the semiconductor layer 115. Accordingly, this allows a stripper to infiltrate between the photo-resist pattern 200A and the ohmic contact layer 116 to facilitate the lift-off process of removing the photo-resist pattern 200A coated with the transparent conductive film 117, thereby improving the lift-off efficiency.

Referring to FIG. 7D, the photo-resist pattern 200A coated with the transparent conductive film 117 shown in FIG. 7C is removed by the lift-off process.

Figure 8A:
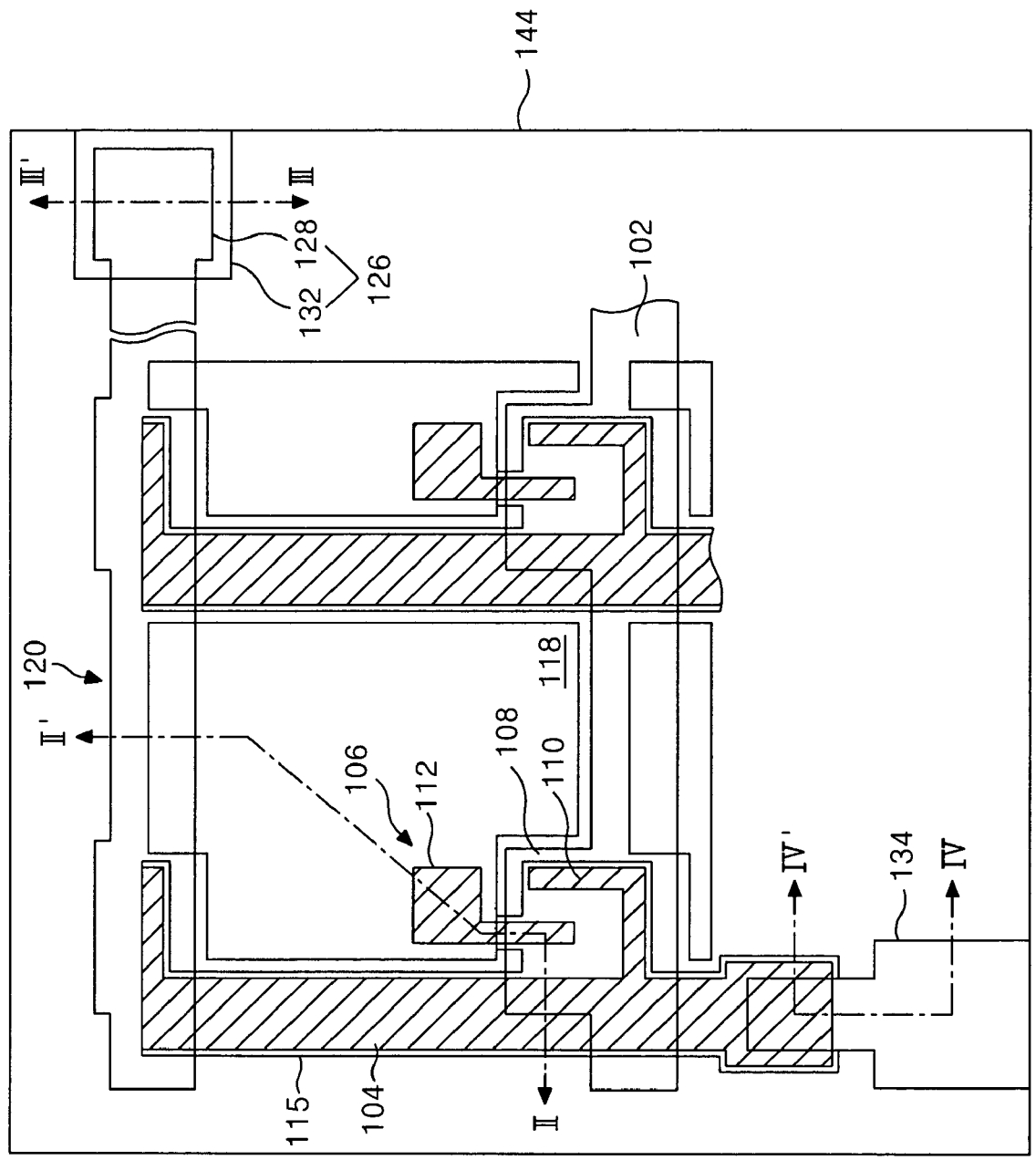

FIG. 8A and FIG. 8B are a plan view and a section view, respectively, for explaining a third mask process in a method of fabricating the thin film transistor substrate according to an embodiment of the present invention and FIG. 9A to FIG. 9D are section views for specifically explaining the third mask process.

A source/drain metal pattern including the data line 104, the source electrode 110 and the drain electrode 112 is formed on the lower substrate 142 having a semiconductor layer 115 and the transparent conductive pattern by the three mask process. Further, the semiconductor layer 115 not overlapping with the source/drain metal pattern is removed, and the active layer 114 between the source electrode 110 and the drain electrode 112 is also exposed, thereby defining a channel of the thin film transistor 106. The source/drain metal pattern and the channel of the thin film transistor 106 are formed by a single mask process employing a partial transmitting mask such as a diffractive exposure mask or a half tone mask, etc.

Referring to FIG. 9A, a source/drain metal layer is formed on the lower substrate 142 that includes the semiconductor layer 115 and the transparent conductive pattern by a deposition technique such as the sputtering, etc. The source/drain metal layer employs a single layer made from a metal material such as Mo, Ti, Cu, AlNd, Al, Cr, a Mo alloy, a Cu alloy or an Al alloy, etc., or takes a stacked structure of at least double layers such as Al/Cr, Al/Mo, Al(Nd)/Al, Al(Nd)/Cr, Mo/Al (Nd)/Mo, Cu/Mo, Ti/Al(Nd)/Ti, Mo/Al, Mo/Ti/Al(Nd), Cu-alloy/Mo, Cu-alloy/Al, Cu-alloy/Mo-alloy, Cu-alloy/Al-alloy, Al/Mo alloy, Mo-alloy/Al, Al-alloy/Mo-alloy, Mo-alloy/Al-alloy, Mo/Al alloy, Cu/Mo alloy or Cu/Mo(Ti), etc.

Subsequently, a second photo-resist pattern 210 including photo-resist patterns 210A and 210B having a different thickness is formed on the source/drain metal layer by photolithography using a partial transmitting mask. The partial transmitting mask includes a shielding portion that shields the ultraviolet rays, a partial transmitting portion that diffracts the ultraviolet rays using a slit pattern or that partially transmits the ultraviolet ray using a phase-shifting material, and a full transmitting portion that fully transmits the ultraviolet rays. The second photo-resist pattern 210 including different thickness photo-resist patterns 210A and 210B and an aperture portion is formed by using photolithography with the partial transmitting mask. In this case, a relatively thick photo-resist pattern 210A is provided at a shielding area P1 overlapping the shielding part of the partial transmitting mask; the photo-resist pattern 210B that is thinner than the photo-resist pattern 210A is provided at a partial exposure area P2 overlapping the partial transmitting portion; and the aperture portion is provided at an full exposure area P3 overlapping the full transmitting portion.

Further, the source/drain metal layer is patterned by an etching process using the second photo-resist pattern 210 to thereby provide the source/drain metal pattern including the data line 104, the drain electrode 112, and the source electrode 110. The source/drain metal layer is patterned by a wet etching process, so that the source/drain metal pattern has an over-etched structure in comparison to the second photo-resist pattern 210. The drain electrode 112 and the lower storage electrode 122 protrude from the overlapping portion of the semiconductor layer 115 and the gate insulating film 144 into the pixel hole 170 to be connected to the pixel electrode 118. The data line 104 also protrudes from the overlapping portion of the semiconductor layer 115 and the gate insulating film 144 into the second contact hole 138 to be connected to the data pad 134.

Referring to FIG. 9B, the semiconductor layer 115 exposed by the second photo-resist pattern 210 is etched, so that the semiconductor layer 115 exists only in the area where it overlaps the second photo-resist pattern 210. The exposed semiconductor layer 115 is etched by a dry etching process by utilizing the second photo-resist pattern 210 as a mask. Thus, the semiconductor layer 115 remains in the area where it overlaps the second photo-resist pattern 210 used to form the source/drain metal pattern, and as a result it overlaps the source/drain metal pattern. Also, the edge of the semiconductor layer 115 protrudes from under the source/drain metal pattern. As a result, the source/drain metal pattern covers the semiconductor layer 115 with a step shape.

Referring to FIG. 9C, the thickness of the photo-resist pattern 210A is thinned, and the photo-resist pattern 210B is removed by the ashing process using an oxygen (O2) plasma. Such an ashing process may be incorporated with the dry etching process for etching the exposed semiconductor layer 115 and performed within the same chamber. Further, the exposed source/drain metal pattern and the ohmic contact layer 116 are removed by the etching process using the ashed photo-resist pattern 210A. Thus, the source electrode 110 and the drain electrode 112 are disconnected from each other, and the thin film transistor 106 having a channel with the exposed active layer 114 between the electrodes is completed.

Furthermore, the surface of the active layer 114 exposed by the surface treatment process using an oxygen (O2) plasma is oxidized by SiO2. Thus, the active layer 114 defining channel of the thin film transistor 106 may be protected by the surface layer 124 oxidized by SiO2.

Referring to FIG. 9D, the photo-resist pattern 210A shown in FIG. 9C is removed by a stripping process.

As described above, the method of fabricating the thin film transistor substrate according to the first embodiment of the present invention may reduce the number of processes with the three step mask process.

Figure 10:
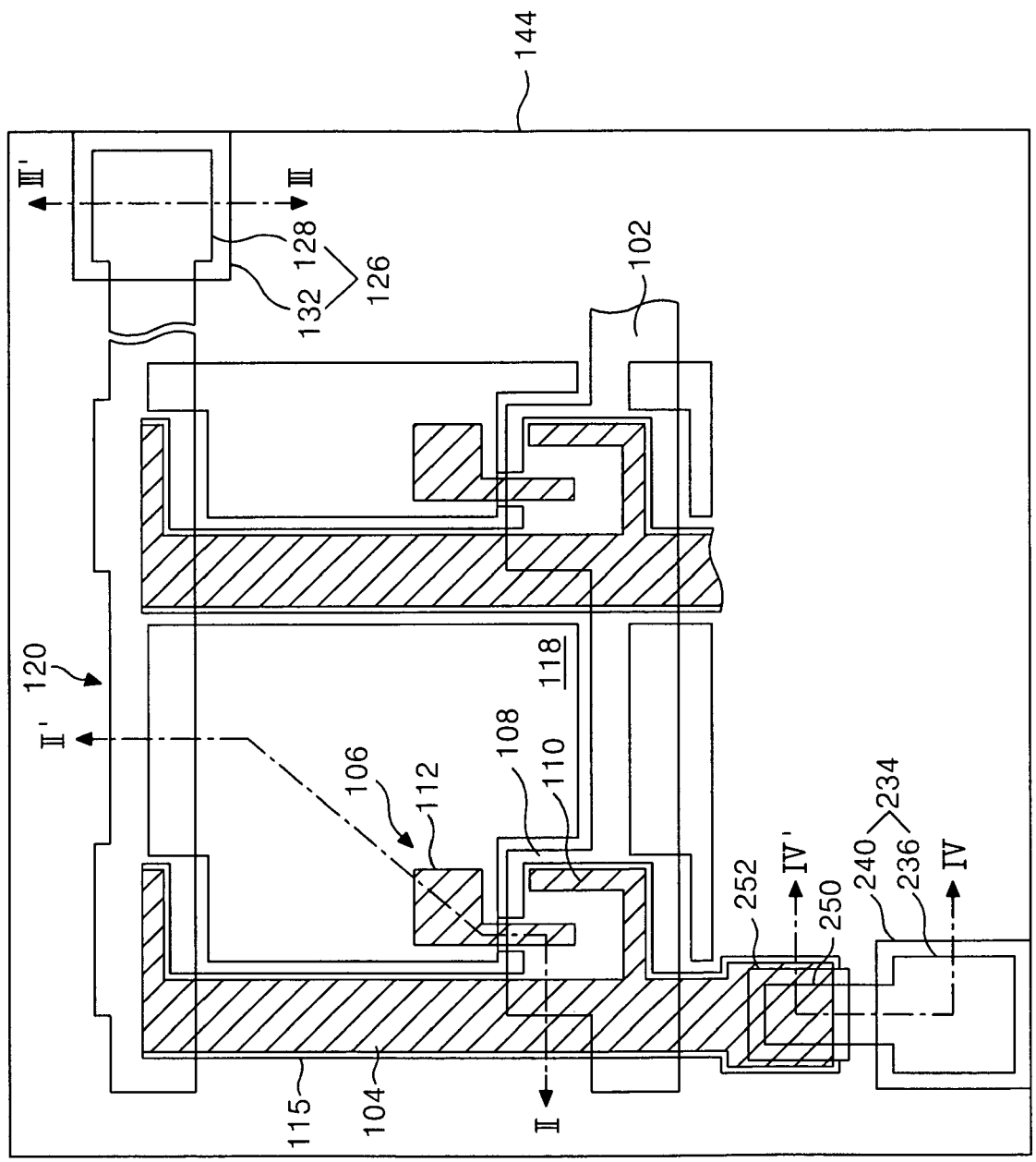
FIG. 10 is a plan view showing a portion of a thin film transistor substrate according to a second embodiment of the present invention.
Figure 11:
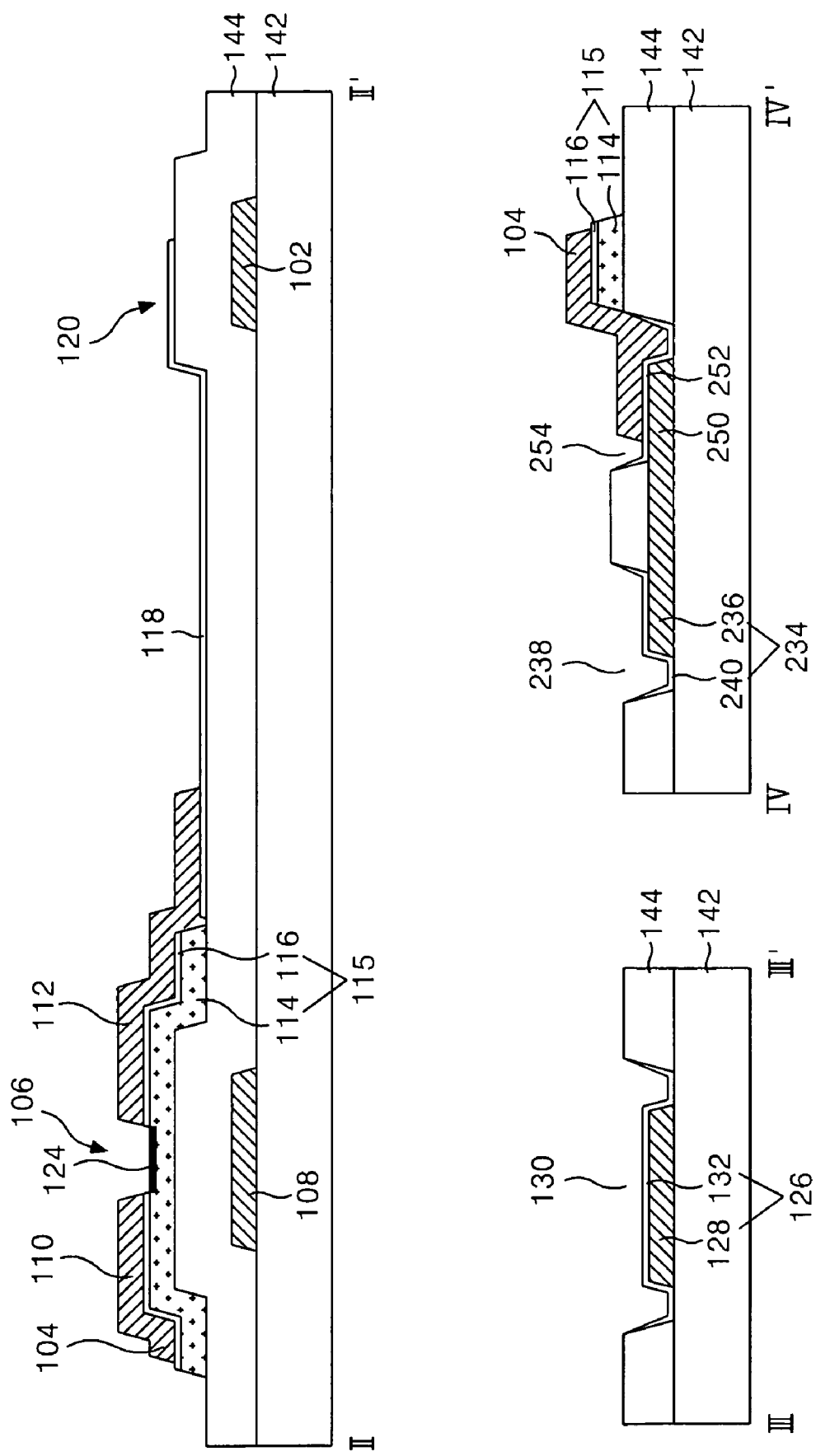
FIG. 11 is a section view of the thin film transistor substrate taken along the II-II', III-III' and IV-IV' lines in FIG. 10.

FIG. 10 is a plan view showing a portion of a thin film transistor substrate according to a second embodiment of the present invention, and FIG. 11 is a section view of the thin film transistor substrate taken along the II-II', III-III' and IV-IV' lines in FIG. 10.

The thin film transistor substrate shown in FIG. 10 and FIG. 11 has the same elements as the thin film transistor substrate shown in FIG. 2 and FIG. 3A except that a data pad 234 has a vertical structure identical to the gate pad 126; and it further includes a contact electrode 252 to connect a data link 250 extending from the data pad 234 to the data line 104. Therefore, an explanation as to the same elements as found in FIG. 2 and FIG. 3A will be omitted.

Referring to FIG. 10 and FIG. 11, the data pad 234 includes a lower data pad electrode 236 provided on the substrate 142 and an upper data pad electrode 240 provided within a second contact hole 238 passing through the gate insulating film 144 to expose the lower data pad electrode 236 to be connected to the lower data pad electrode 236 similar to the gate pad 126.

The data link 250 extends from the lower electrode 236 of the data pad 234 so as to overlap with the data line 104 and is exposed through a third contact hole 254 passing through the gate insulating film 144. The data link 250 is connected, via the contact electrode 252 in the third contact hole 254, to the data line 104.

The lower data pad electrode 236 and the data link 250, along with the lower gate pad electrode 128, are created by the first mask process. The second and third contact holes 238 and 254, along with the first contact hole 130, are formed by the second mask process. In the second mask process, the upper data pad electrode 240 and the contact electrode 252, along with the upper gate pad electrode 132, are formed within the second and third contact holes 238 and 254, respectively. In this case, the upper data pad electrode 240 and the contact electrode 252 interface with the edge of the gate insulating film 144 and enclose the second and third contact holes 238 and 254.

Further, the data line 104 is positioned within an area sealed by the sealant, so that it can be protected by the alignment film coated thereon or the liquid crystal filled in the sealed area. To this end, the contact electrode 252 that connects the data line 104 to the data link 250 is located within the sealed area.

Figure 12:
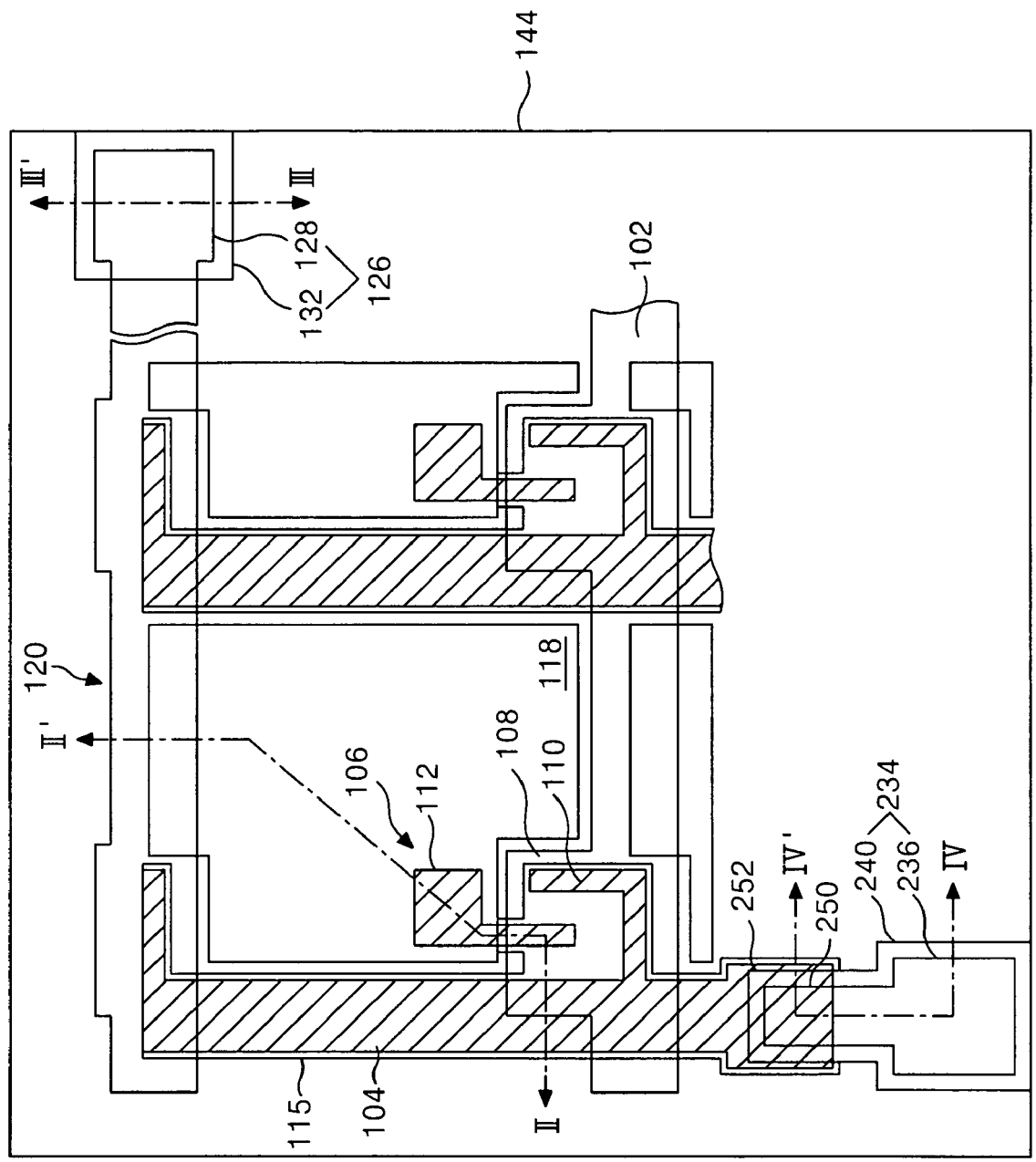
FIG. 12 is a plan view showing a portion of a thin film transistor substrate according to a third embodiment of the present invention.
Figure 13:
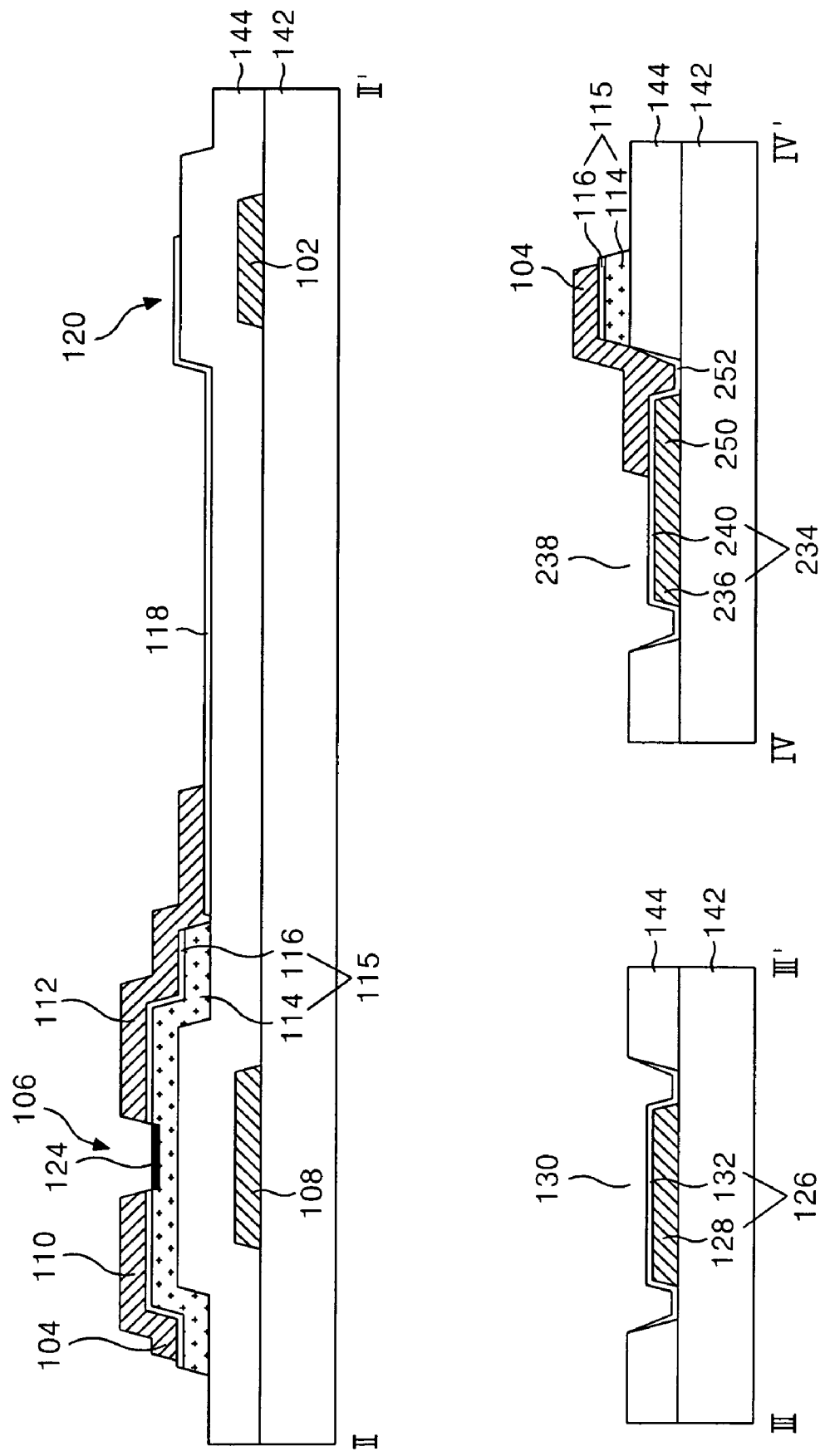
FIG. 13 is a section view of the thin film transistor substrate taken along the II-II', III-III' and IV-IV' lines in FIG. 12.

FIG. 12 is a plan view showing a portion of a thin film transistor substrate according to a third embodiment of the present invention, and FIG. 13 is a section view of the thin film transistor substrate taken along the II-II', III-III' and IV-IV' lines in FIG. 12.

The thin film transistor substrate shown in FIG. 12 and FIG. 13 has the same elements as the thin film transistor substrate shown in FIG. 10 and FIG. 11 except that an upper data pad electrode 240 and a contact hole 252 are integrally formed within a second contact hole 238 extended along a data link 250. Therefore, an explanation as to the same elements as found in FIG. 10 and FIG. 11 will be omitted.

Referring to FIG. 12 and FIG. 13, the second contact hole 238 of the data pad 234 extends along the data link 250 in such a manner to overlap with the data line 104. Thus, the upper data pad electrode 240 and the contact electrode 252 are formed in an integral structure within the second contact hole 238 to be connected to the data line 104. The upper data pad electrode 240 and the contact electrode 252 interface with the edge of the gate insulating film 144 enclosing the second contact hole 238.

Figure 14:
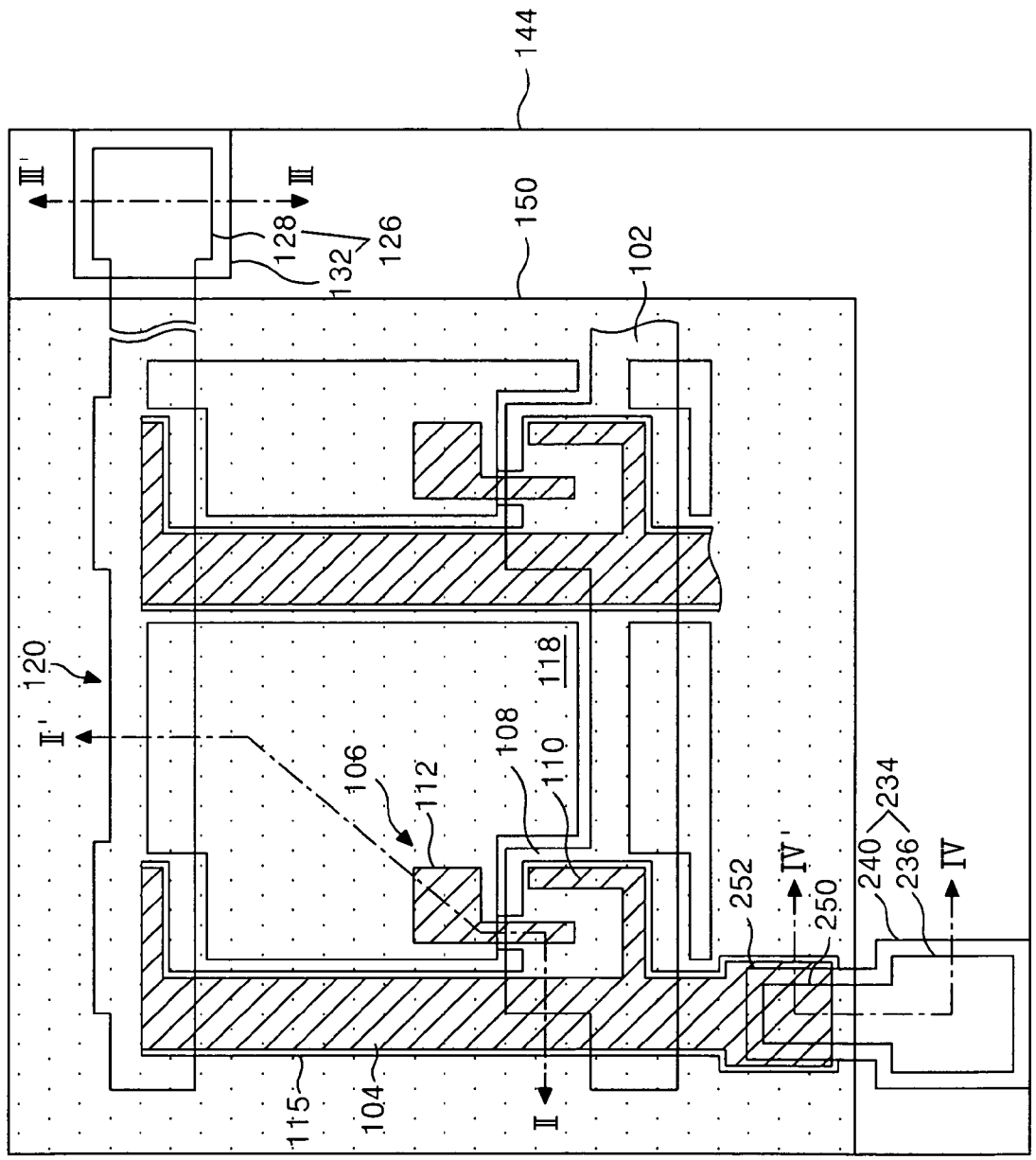
FIG. 14 is a plan view showing a portion of a thin film transistor substrate according to a fourth embodiment of the present invention.

FIG. 14 is a plan view showing a portion of a thin film transistor substrate according to a fourth embodiment of the present invention, and FIG. 15 is a section view of the thin film transistor substrate taken along the II-II', III-III' and IV-IV' lines in FIG. 14.

The thin film transistor substrate shown in FIG. 14 and FIG. 15 has the same elements as the thin film transistor substrate shown in FIG. 12 and FIG. 13 except that it further includes a protective film 150 that is placed outside the gate pad area 126 and the data pad area 234. Therefore, an explanation as to the same elements as found in FIG. 14 and FIG. 15 will be omitted.

Referring to FIG. 14 and FIG. 15, the protective film 150 is formed on the substrate 142 with the source/drain metal pattern so as to be open at the pad area where the gate pad 126 and the data pad 134 are provided. The protective film 150 may be formed from an inorganic insulating film like the gate insulating film 144. Alternatively, the protective film 150 may be formed from an acrylic organic compound, BCB (benzocyclobutene) or PFCB (perfluorocyclobutane), etc.

The protective film 150 is formed by a fourth mask process or by a rubber stamp printing system like the alignment film that will be formed into the uppermost layer. Further, the protective film 150 is entirely formed on the substrate 142 and then is removed at the pad area by the etching process using the alignment film as a mask or by the etching process using the color filter substrate as a mask after the substrate 142 is joined to the color filter substrate.

First, when the fourth mask process is used, the protective film 150 is entirely formed on the substrate 142 provided with the source/drain metal pattern. In this case, the protective film 150 is formed by PECVD, spin coating or spinless coating, etc. Further, the protective film 150 is patterned by photolithography and an etching process using a fourth mask.

Second, the protective film 150 may be printed only at the array area outside the pad area by the rubber stamp printing technique that is a method to form the alignment film to be provided thereon. In other words, the protective film 150 is formed by aligning a rubber mask on the substrate 142 provided with the source/drain metal pattern and then printing an insulating material only at an array area outside the pad area by the rubber stamp printing technique.

Third, the protective film 150 is removed at the pad area by an etching process using the alignment film provided thereon. More specifically, as shown in FIG. 16A, the protective film 150 is formed on the entire substrate 142, and the alignment film 152 is formed on the protective film 150 using the rubber stamp printing method. Subsequently, as shown in FIG. 16B, the protective film 150 is removed at the pad area by the etching process using the alignment film 152 as a mask.

Figure 17B:
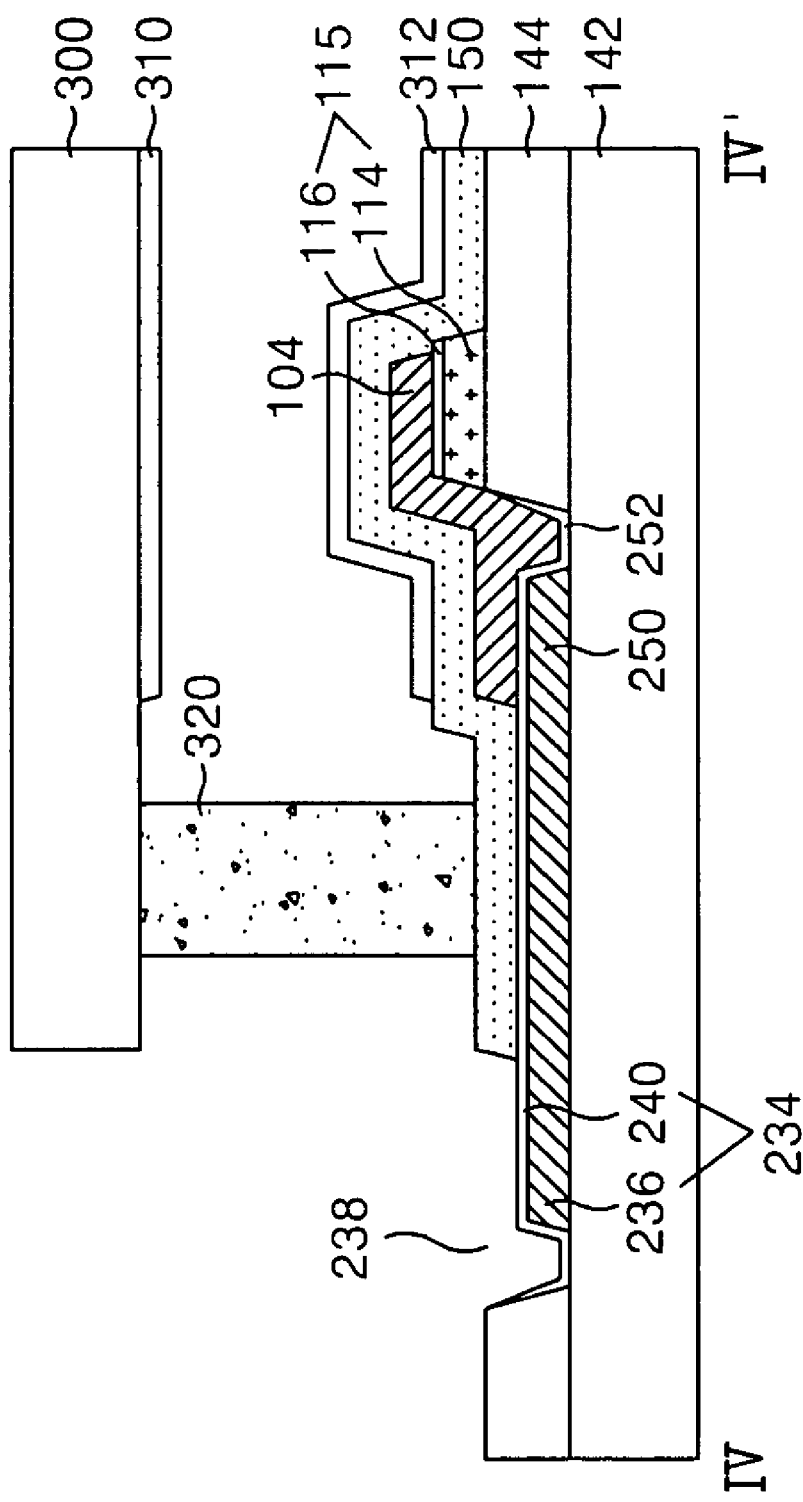

Fourth, the protective film 150 is removed at the pad area by the etching process using the color filter substrate as a mask. More specifically, as shown in FIG. 17A, the thin film transistor substrate provided with the protective film 150 and having the lower alignment film 312 provided thereon is joined by the sealant 320 to the color filter substrate 300 with an upper alignment film 310. Next, as shown in FIG. 17B, the protective film 150 is removed at the pad area by the etching process using the color filter substrate 300 as a mask. In this case, the protective film 150 is removed at the pad area by the etching process using plasma or is removed at the pad area by dipping the liquid crystal display panel in which the thin film transistor substrate is joined to the color filter substrate 300 into an etching vessel filled with an echant liquid.

As described above, according to the present invention, the semiconductor layer and the gate insulating film are simultaneously patterned by a single mask process using the partial transmitting mask to provide a plurality of holes having different depths and to provide the transparent conductive patterns within the plurality of holes by the lift-off process of the photo-resist pattern used in the mask process.

Furthermore, according to the present invention, the semiconductor layer patterned simultaneously with the gate insulating film is again patterned upon formation of the source/drain metal pattern to remove the exposed portion thereof, and the active layer between the source electrode and the drain electrode is exposed to define the channel of the thin film transistor. Thus, the semiconductor layer exists only in the channel of the thin film transistor and the overlapping portion of the source/drain metal pattern and the gate insulating film.

Moreover, according to the present invention, the protective film has an open pad area that is provided by the printing technique, the fourth mask process, the etching process using the alignment film as a mask or the etching process using the color filter substrate as a mask, etc.

Accordingly, the method of fabricating the thin film transistor according to the present invention may be simplified by the four step mask process, so that the material cost, the equipment investment cost, etc. are reduced as well as to improve productivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   first and second substrates;
   a gate line on the first substrate;
   a gate insulating film on the first substrate;
   a data line crossing the gate line to define a pixel area;
   a pixel hole in the pixel area;
   a pixel electrode formed of a transparent conductive layer on the gate insulating film in the pixel hole in the pixel area;
   a thin film transistor including a gate electrode, a source electrode, a drain electrode, and a semiconductor layer;
   a pad connected to at least one of the gate line and the data line, and including a lower pad electrode on the substrate and an upper pad electrode in a first contact hole that passes through the gate insulating film to expose the lower pad electrode and connected to the lower pad electrode;
   a data link extending from the lower pad electrode and overlapping with the data line, wherein the data link and the lower pad electrode are formed on a same layer;
   a contact electrode in a second contact hole that passes through the gate insulating film to expose the data link to connect the data link to the data line, the contact electrode having a first surface contacted with the data line and a second surface contacted with the data link,
   wherein the semiconductor layer overlaps with a source/drain metal pattern including the data line, the source electrode, and the drain electrode;
   wherein the drain electrode protrudes from the semiconductor layer toward an upper portion of the pixel electrode, and the drain electrode connects to the pixel electrode; and
   wherein the semiconductor layer is removed from where it overlaps the transparent conductive layer.

2. The liquid crystal display device as claimed in claim 1, further comprising a storage capacitor having a portion of the pixel electrode overlapping the gate line with the gate insulating film therebetween.

3. The liquid crystal display device as claimed in claim 1, wherein the contact hole of upper pad electrode extends along the data link to be integral to the second contact hole, and the upper pad electrode is integral to the contact electrode.

4. The liquid crystal display device as claimed in claim 1, wherein the upper pad electrode and the contact electrode borders with the gate insulating film enclosing the corresponding hole.

5. The liquid crystal display device as claimed in claim 1, wherein the pixel electrode, the upper pad electrode, and the contact electrode are formed of a transparent conductive layer.

6. The liquid crystal display device as claimed in claim 1, wherein a contact area between the data line and the contact electrode is within an area to be sealed by a sealant upon joining of the thin film transistor substrate with a second substrate.

7. The liquid crystal display device as claimed in claim 1, the pad comprising:
 a data pad in contact holes that passes through the gate insulating film and connected to the data line.

8. The liquid crystal display device as claimed in claim 7, wherein the data pad is formed of a transparent conductive layer and borders with the gate insulating film enclosing the contact hole.

9. The liquid crystal display device as claimed in claim 1, the pad comprising a data pad formed of a transparent conductive layer on the gate insulating film and connected to the data line.

10. The liquid crystal display device as claimed in claim 7, wherein the data line protrudes from an area where it overlaps the semiconductor layer toward an upper portion of the data pad.

11. The liquid crystal display device as claimed in claim 9, wherein the data line protrudes from an area where it overlaps the semiconductor layer toward an upper portion of the data pad.

12. The liquid crystal display device as claimed in claim 10, wherein the data line is within an area to be sealed by a sealant upon joining of the first substrate with the second substrate.

13. The liquid crystal display device as claimed in claim 11, wherein the data line is within an area to be sealed by a sealant upon joining of the first substrate with the second substrate.

14. The liquid crystal display device as claimed in claim 1, wherein a channel of the thin film transistor further includes a surface layer oxidized by a plasma treatment.

15. The liquid crystal display device as claimed in claim 1, wherein the semiconductor layer and the source/drain metal pattern have a shape.

16. The liquid crystal display device as claimed in claim 1, further comprising a protective film on the substrate with an opening at a pad area provided with the pad.

17. The liquid crystal display device as claimed in claim 16, further comprising an alignment film on the protective film.

18. The liquid crystal display device as claimed in claim 17, wherein the protective film has the same pattern as the alignment film.

19. The liquid crystal display device as claimed in claim 16, wherein the protective film is formed in the same pattern as the second substrate.

20. The liquid crystal display device as claimed in claim 17, wherein the protective film is opened at the pad area.

21. The liquid crystal display device as claimed in claim 1, further comprising:
 a color filter layer on the second substrate; and
 a liquid crystal layer between the first and second substrates.

* * * * *